(12) United States Patent
Kawashima

(10) Patent No.: US 8,572,824 B2
(45) Date of Patent: Nov. 5, 2013

(54) METHOD FOR MANUFACTURING QUARTZ CRYSTAL UNIT AND QUARTZ CRYSTAL OSCILLATOR HAVING THE QUARTZ CRYSTAL UNIT

(75) Inventor: Hirofumi Kawashima, Tokyo (JP)

(73) Assignee: Piedek Technical Laboratory (JP)

( * ) Notice: Subject to any disclaimer, the term of this patent is extended or adjusted under 35 U.S.C. 154(b) by 216 days.

(21) Appl. No.: 13/066,422

(22) Filed: Apr. 14, 2011

(65) Prior Publication Data

US 2011/0191996 A1 Aug. 11, 2011

Related U.S. Application Data

(60) Continuation of application No. 12/286,863, filed on Oct. 2, 2008, now Pat. No. 7,944,131, which is a division of application No. 11/198,731, filed on Aug. 5, 2005, now Pat. No. 7,441,316, which is a division of application No. 10/412,470, filed on Apr. 11, 2003, now Pat. No. 6,959,472.

(30) Foreign Application Priority Data

Apr. 23, 2002 (JP) ................................ 2002-158320

(51) Int. Cl.
*H01L 41/22* (2006.01)
(52) U.S. Cl.
USPC ............. 29/25.35; 29/593; 29/594; 29/25.41; 29/846

(58) Field of Classification Search
USPC ............. 29/25.35, 594, 593, 832, 854, 25.41; 310/319, 370, 367, 320, 438, 351; 216/13, 80, 97; 331/154, 156, 158
See application file for complete search history.

(56) References Cited

U.S. PATENT DOCUMENTS

| | | | | |
|---|---|---|---|---|
| 4,313,071 A | * | 1/1982 | Hermann et al. | 310/361 |
| 5,274,297 A | * | 12/1993 | Hermann et al. | 310/361 |
| 5,861,705 A | * | 1/1999 | Wakatsuki et al. | 310/370 |
| 6,707,234 B1 | * | 3/2004 | Kawashima | 310/367 |

* cited by examiner

*Primary Examiner* — Peter DungBa Vo
*Assistant Examiner* — Kaying Kue
(74) *Attorney, Agent, or Firm* — Adams & Wilks

(57) ABSTRACT

A method for manufacturing a quartz crystal unit comprises disposing a metal film on a surface of a quartz crystal wafer, disposing a resist on the metal film, forming a tuning fork shape pattern on the surface, etching the quartz crystal wafer to form a quartz crystal tuning fork shape having a base and first and second tines, forming electrodes on opposite side surfaces of the first and second tines so that the electrode of the first tine has an electrical polarity opposite to an electrical polarity of the electrode of the second tine to form a quartz crystal tuning fork resonator that vibrates in a flexural mode of an inverse phase, removing the resist before forming the electrodes, mounting the tuning fork resonator on a mounting portion of the case, disposing a metal or a glass into a through-hole of the case, and adjusting an oscillation frequency of the tuning fork resonator.

38 Claims, 10 Drawing Sheets

METHOD FOR MANUFACTURING QUARTZ CRYSTAL UNIT AND QUARTZ CRYSTAL OSCILLATOR HAVING THE QUARTZ CRYSTAL UNIT

CROSS REFERENCE TO RELATED APPLICATIONS

This application is a continuation of application Ser. No. 12/286,863 filed Oct. 2, 2008, now U.S. Pat. No. 7,944,131, which is a division of application Ser. No. 11/198,731 filed Aug. 5, 2005 and now U.S. Pat. No. 7,441,316, which is a division of application Ser. No. 10/412,470 filed Apr. 11, 2003 and now U.S. Pat. No. 6,959,472.

FIELD OF THE INVENTION

The present invention relates to a quartz crystal resonator, a quartz crystal unit and a quartz crystal oscillator, and their manufacturing methods.

BACKGROUND OF THE INVENTION

In general, a quartz crystal resonator is housed in a quartz crystal unit and a quartz crystal oscillator comprises the quartz crystal unit. For example, a quartz crystal oscillator with a quartz crystal unit comprising a contour mode resonator such as a quartz crystal tuning fork resonator, which is capable of vibrating in a flexural mode, is widely used as a time standard in consumer products, wearable time-keeping equipment and communication equipment (such as cellular phones, wristwatches and pagers). Recently, because of high frequency stability, miniaturization and the light weight nature of these products, the need for a smaller quartz crystal unit and a smaller quartz crystal oscillator with a smaller quartz crystal tuning fork resonator, capable of vibrating in a flexural mode and having a high frequency stability, a small series resistance and a high quality factor has arisen.

Heretofore, however, it has been impossible to obtain a quartz crystal unit and a quartz crystal oscillator because a conventional quartz crystal tuning fork resonator, capable of vibrating in a flexural mode can not be obtained with a high frequency stability, a small series resistance and a high quality factor when it is miniaturized.

Moreover, nothing teaches figure of merit M of the present invention which has an influence on a frequency stability for a flexural mode, quartz crystal tuning fork resonator capable of vibrating in a fundamental mode and teaches a relationship of an amplification circuit and a feedback circuit which construct a quartz crystal oscillating circuit of the present invention, and also, nothing teaches a method of manufacturing a quartz crystal tuning fork resonator capable of vibrating in a flexural mode, a quartz crystal unit and a quartz crystal oscillator of the present invention.

Likewise, nothing teaches a method for manufacturing a quartz crystal unit comprising a contour mode resonator such as a width-extensional mode quartz crystal resonator, a length-extensional mode quartz crystal resonator and a Lame mode quartz crystal resonator, and their resonators, according to the present invention.

In addition, for example, there been has a big problem in the conventional quartz crystal oscillator with the conventional quartz crystal tuning fork resonator, such that a fundamental mode vibration of the resonator jumps to a second overtone mode vibration by shock or vibration.

It is, therefore, a general object of the present invention to provide embodiments of a contour mode resonator such as a flexural mode, quartz crystal tuning fork resonator, a width-extensional mode quartz crystal resonator, a length-extensional mode quartz crystal resonator and a Lame mode quartz crystal resonator, a quartz crystal unit with the contour mode resonator and a quartz crystal oscillator comprising a quartz crystal oscillating circuit with a flexural mode, quartz crystal tuning fork resonator, capable of vibrating in a fundamental mode, and having a high frequency stability, a small series resistance and a high quality factor, and also to provide embodiments of a method for manufacturing the contour mode resonator, the quartz crystal unit and the quartz crystal oscillator, which overcome or at least mitigate one or more of the above problems.

SUMMARY OF THE INVENTION

The present invention relates to a flexural mode, quartz crystal tuning fork resonator, capable of vibrating in a fundamental mode and having a nominal frequency of 32.768 kHz, a quartz crystal unit comprising a contour mode resonator such as a flexural mode, quartz crystal tuning fork resonator, a width-extensional mode quartz crystal resonator, a length-extensional mode quartz crystal resonator and a Lame mode quartz crystal resonator, and a quartz crystal oscillator comprising a quartz crystal oscillating circuit having an amplification circuit and a feedback circuit, and also relates to their manufacturing methods.

It is an object of the present invention to provide a flexural mode, quartz crystal tuning fork resonator capable of vibrating in a fundamental mode and having a nominal frequency of 32.768 kHz.

It is an another object of the present invention to provide a quartz crystal unit comprising a contour mode quartz crystal resonator.

It is a further object of the present invention to provide a quartz crystal oscillator comprising a quartz crystal oscillating circuit with a flexural mode, quartz crystal tuning fork resonator, capable of vibrating in a fundamental mode, and having a nominal frequency of 32.768 kHz, a high frequency stability, a small series resistance $R_1$ and a high quality factor $Q_1$.

It is a still further object of the present invention to provide a method for manufacturing a plurality of individual quartz crystal tuning fork resonators capable of vibrating in a flexural mode, a quartz crystal unit comprising a contour mode quartz crystal resonator, a case and a lid, and a quartz crystal oscillator comprising: a quartz crystal oscillating circuit comprising; an amplification circuit comprising an amplifier at least and a feedback circuit comprising a flexural mode, quartz crystal tuning fork resonator and capacitors at least.

According to one aspect of the present invention, there is provided a method for manufacturing a plurality of individual quartz crystal tuning fork resonators each of which is capable of vibrating in a flexural mode, and each of the individual quartz crystal tuning fork resonators comprising the steps of: forming integrally tuning fork tines each of which has a length, a width and a thickness and the length greater than the width and the thickness, and a tuning fork base; providing grooves; and disposing electrodes inside the grooves and on sides of said tuning fork tines, and the grooves being provided at said tuning fork tines, and the electrodes being disposed opposite each other inside the grooves and on the sides of said tuning fork tines so that the electrodes disposed opposite each other are of opposite electrical polarity and said tuning fork tines are capable of vibrating in inverse phase, wherein the individual quartz crystal tuning fork resonators are provided in a quartz crystal wafer with resonance frequency higher than 32.768 kHz, each of which is capable of vibrating in a fundamental mode, and next, metal films are formed on said tuning fork tines in the quartz crystal wafer by a spattering method or an evaporation method so as to get the individual quartz crystal tuning fork resonators each of which has resonance frequency lower than 32.768 kHz, and wherein comprising the further steps of: adjusting the resonance frequency by removing a part or all of the metal films formed on said tuning fork tines in the quartz crystal wafer by laser trimming or a plasma etching method and inspecting the individual quartz crystal tuning fork resonators in the quartz crystal wafer, and when there is a failure resonator therein, it is removed from the quartz crystal wafer or something is marked on it or it is remembered by a computer.

According to a second aspect of the present invention, there is provided a method for manufacturing a quartz crystal unit comprising a contour mode quartz crystal resonator which is one of a width-extensional mode quartz crystal resonator, a length-extensional mode quartz crystal resonator and a Lame mode quartz crystal resonator, a case and a lid, and said contour mode quartz crystal resonator comprising the step of: utilizing a particle method or a chemical etching method to form a resonator comprising; a vibrational portion; connecting portions located at ends of said vibrational portion; supporting portions connected to said vibrational portion through said connecting portions; and electrodes disposed opposite each other on upper and lower faces of said vibrational portion so that the electrodes disposed opposite each other are of opposite electrical polarity, wherein a plurality of individual contour mode quartz crystal resonators are formed in a quartz crystal wafer, each of which is capable of vibrating in a contour mode and a single mode, and wherein each of said individual contour mode quartz crystal resonators is mounted at a mounting portion of a case, and the resonance frequency of each resonator is adjusted by laser trimming or a plasma etching method so that a frequency deviation is within a range of −100 PPM to +100 PPM to a nominal frequency of less than 135 MHz when the quartz crystal unit is provided.

According to a third aspect of the present invention, there is provided a method for manufacturing a quartz crystal oscillator comprising: a quartz crystal oscillating circuit comprising; an amplification circuit comprising an amplifier at least and a feedback circuit comprising a quartz crystal tuning fork resonator and capacitors at least, said quartz crystal tuning fork resonator comprising the steps of: forming integrally tuning fork tines each of which has a length, a width and a thickness and the length greater than the width and the thickness, and a tuning fork base; providing grooves; and disposing electrodes inside the grooves and on sides of said tuning fork tines, and the grooves being provided at said tuning fork tines, and the electrodes being disposed opposite each other inside the grooves and on the sides of said tuning fork tines so that the electrodes disposed opposite each other are of opposite electrical polarity and said tuning fork tines are capable of vibrating in inverse phase, and said quartz crystal oscillating circuit comprising the step of connecting electrically said quartz crystal tuning fork resonator, the amplifier and the capacitors at least, wherein said quartz crystal tuning fork resonator is capable of vibrating in a flexural mode and said quartz crystal oscillating circuit comprises said quartz crystal tuning fork resonator whose figure of merit $M_1$ of a fundamental mode vibration is larger than figure of merit $M_2$ of a second overtone mode vibration to suppress the second overtone mode vibration and to get a high frequency stability for the fundamental mode vibration.

According to a fourth aspect of the present invention, there is provided a method for manufacturing a quartz crystal oscillator comprising: a quartz crystal oscillating circuit comprising; an amplification circuit comprising a CMOS inverter and a feedback resistor, and a feedback circuit comprising a quartz crystal tuning fork resonator capable of vibrating in a flexural mode, resistors and capacitors, said quartz crystal tuning fork resonator comprising the step of: utilizing a chemical etching method to form a resonator comprising; tuning fork tines each of which has a length, a width and a thickness and the length greater than the width and the thickness, and a tuning fork base, and electrodes disposed on obverse and reverse faces and on sides of said tuning fork tines so that said tuning fork tines are capable of vibrating in inverse phase, said quartz crystal tuning fork resonator being formed in a quartz crystal wafer and a plurality of individual quartz crystal tuning fork resonators capable of vibrating each in a fundamental mode being formed therein, each of which comprises: tuning fork tines and a tuning fork base; and electrodes disposed on obverse and reverse faces and on sides of the tuning fork tines, and has resonance frequency higher than 32.768 kHz, wherein comprising the further steps of: forming metal films on the tuning fork tines of the individual quartz crystal tuning fork resonators in the quartz crystal wafer by a spattering method or an evaporation method so as to get the individual quartz crystal tuning fork resonators each of which has resonance frequency of 29.4 kHz to 32.75 kHz; mounting each resonator at a mounting portion of a case; and adjusting the resonance frequency of the each resonator by laser trimming or a plasma etching method so that it is within a range of 32.764 kHz to 32.772 kHz when a quartz crystal unit comprising said quartz crystal tuning fork resonator is provided, wherein said quartz crystal oscillating circuit comprising the amplification circuit and the feedback circuit is constructed so that a ratio of an absolute value of negative resistance, $|-RL_1|$ of a fundamental mode vibration of the amplification circuit and series resistance $R_1$ of the fundamental mode vibration is larger than that of an absolute value of negative resistance, $|-RL_2|$ of a second overtone mode vibration of the amplification circuit and series resistance $R_2$ of the second overtone mode vibration, and an output signal of said quartz crystal oscillating circuit is outputted through a buffer circuit and has a frequency of 32.764 kHz to 32.772 kHz, and wherein comprising the further step of inspecting the individual quartz crystal tuning fork resonators formed in the quartz crystal wafer, and when there is a failure resonator therein, it is removed from the quartz crystal wafer or something is marked on it or it is remembered by a computer.

The present invention will be more fully understood by referring to the following detailed specification and claims taken in connection with the appended drawings.

DETAILED DESCRIPTION

Figure 1:
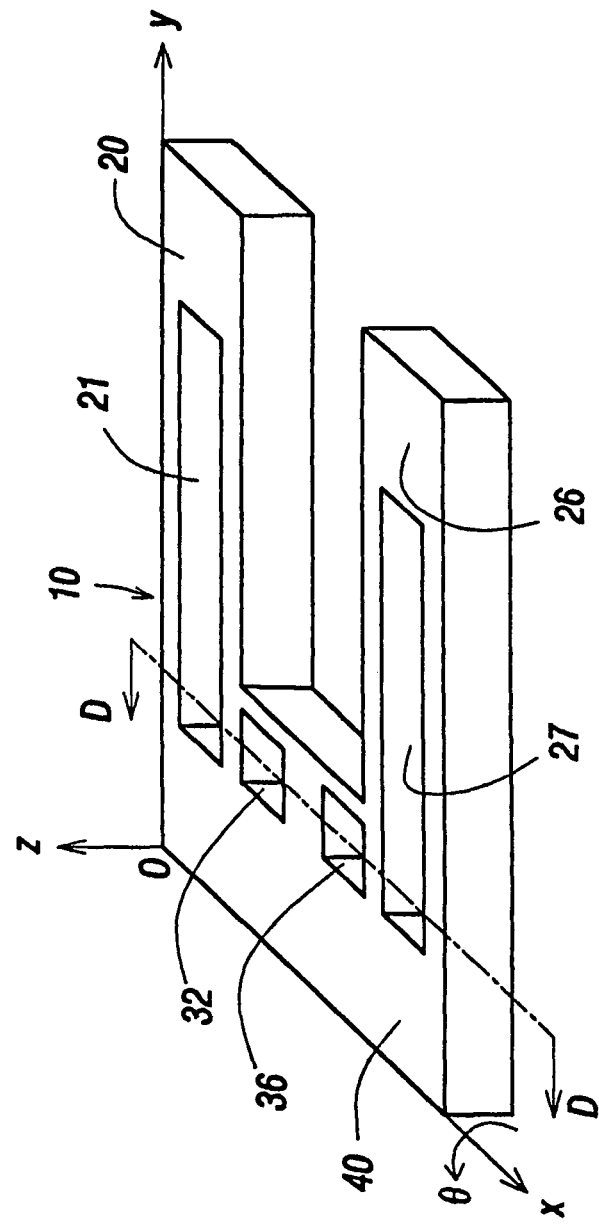
FIG. 1 shows a general view of a flexural mode, quartz crystal tuning fork resonator embodying the present invention.

Referring now to the drawings, the embodiments of the present invention will be described in more detail.

FIG. 1 shows a general view of a flexural mode, quartz crystal tuning fork resonator 10 embodying the present invention and its coordinate system o-xyz. A cut angle θ, which has a typical value of 0° to 10°, is rotated from a Z-plate perpendicular to the z axis about the x axis. The quartz crystal resonator 10 comprises two tuning fork tines 20 and 26 and a tuning fork base 40. The tines 20 and 26 have grooves 21 and 27 respectively, with the grooves 21 and 27 extending into the base 40. In addition, the base 40 has the additional grooves 32 and 36.

Figure 2:
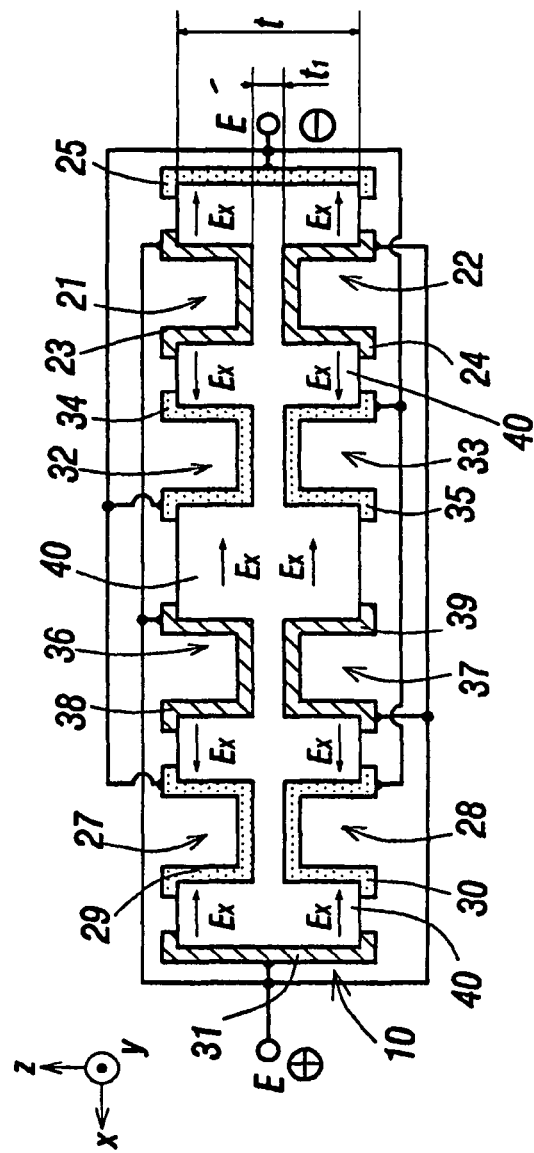
FIG. 2 shows a D-D' cross-sectional view of the tuning fork base of FIG. 1, and illustrating electrode construction.

FIG. 2 shows a D-D' cross-sectional view of the tuning fork base 40 for the quartz crystal resonator 10 of FIG. 1. In FIG. 2, the shape of the electrode construction within the base 40 for the quartz crystal resonator of FIG. 1 is described in detail. The section of the base 40 which couples to the tine 20 has the grooves 21 and 22 cut into the obverse and reverse faces of the base 40. Also, the section of the base 40 which couples to the tine 26 has the grooves 27 and 28 cut into the obverse and reverse faces of the base 40. In addition to these grooves, the base 40 has the grooves 32 and 36 cut between the grooves 21 and 27, and also, the base 40 has the grooves 33 and 37 cut between the grooves 22 and 28.

Furthermore, the grooves 21 and 22 have the first electrodes 23 and 24 both of the same electrical polarity, the grooves 32 and 33 have the second electrodes 34 and 35 both of the same electrical polarity, the grooves 36 and 37 have the third electrodes 38 and 39 both of the same electrical polarity, the grooves 27 and 28 have the fourth electrodes 29 and 30 both of same electrical polarity and the sides of the base 40 have the fifth and sixth electrodes 25 and 31, each of opposite electrical polarity. In more detail, the fifth, fourth, and second electrodes 25, 29, 30, 34 and 35 have the same electrical polarity, while the first, sixth and third electrodes 23, 24, 31, 38 and 39 have the opposite electrical polarity to the others. Two electrode terminals E-E' are constructed. That is, the electrodes disposed inside the grooves constructed opposite each other in the thickness (z axis) direction have the same electrical polarity. Also, the electrodes disposed opposite each other across adjoining grooves have opposite electrical polarity.

In addition, the resonator has a thickness t of the tuning fork tines or the tuning fork tines and the tuning fork base, and a groove thickness $t_1$. It is needless to say that the electrodes are disposed inside the grooves and on the sides of the tuning fork tines. In this embodiment, the first electrodes 23 and 24 are disposed at the tine and the base, and also, the fourth electrodes 29 and 30 are disposed at the tine and the base. In addition, the electrodes are disposed on the sides of the tines opposite each other to the electrodes disposed inside the grooves. Namely, the electrodes are disposed opposite each other inside the grooves and on the sides of the tuning fork tines so that the electrodes disposed opposite each other are of opposite electrical polarity and the tuning fork tines are capable of vibrating in inverse phase.

Now, when a direct current (DC) voltage is applied between the electrode terminals E-E' (E terminal: plus, E' terminal: minus), an electric field Ex occurs in the arrow direction as shown in FIG. 2. As the electric field Ex occurs perpendicular to the electrodes disposed on the base and the tines, the electric field Ex has a very large value and a large distortion occurs at the base and the tines, so that a flexural mode, quartz crystal tuning fork resonator is obtained with a small series resistance $R_1$ and a high quality factor $Q_1$, even if it is miniaturized.

Figure 3:
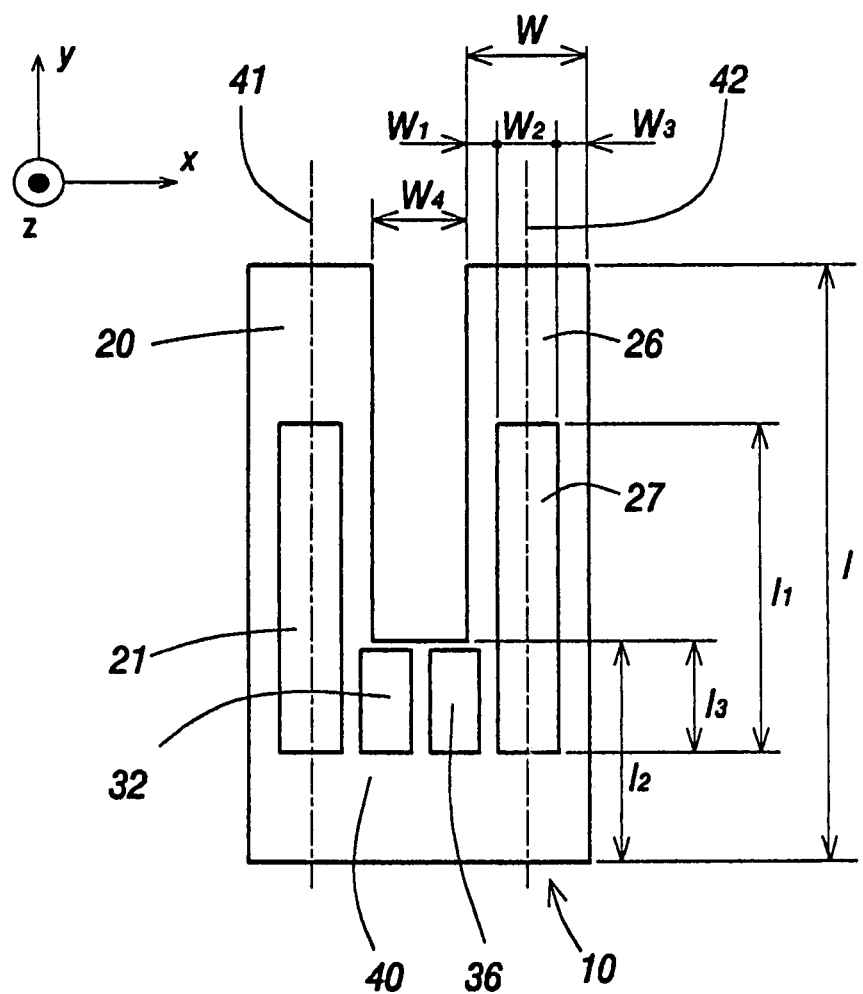
FIG. 3 shows a plan view of a quartz crystal tuning fork resonator of FIG. 1.

FIG. 3 shows a plan view of the resonator 10 of FIG. 1. In FIG. 3, the construction and the dimension of grooves 21, 27, 32 and 36 are described in detail. The groove 21 is constructed to include a portion of the central line 41 of the tine 20, the groove 27 is similarly constructed to include a portion of the central line 42 of the tine 26. The width $W_2$ of the grooves 21 and 27 (groove width $W_2$) which include a portion of the central lines 41 and 42 respectively, is preferable because moment of inertia of the tines 20 and 26 becomes large and the tines can vibrate in a flexural mode very easily. As a result of which the flexural mode, tuning fork, quartz crystal resonator capable of vibrating in a fundamental mode can be obtained with a small series resistance $R_1$ and a high quality factor $Q_1$.

In more detail, when part widths $W_1$, $W_3$ and groove width $W_2$ are taken, the tine width W of the tines 20 and 26 has a relationship of $W=W_1+W_2+W_3$, and a part or all of at least one of the grooves is constructed so that $W_1 \geq W_3$ or $W_1 < W_3$. In addition, the groove width $W_2$ is constructed so that $W_2 \geq W_1, W_3$. In this embodiment, also, the grooves are constructed at the tuning fork tines so that a ratio ($W_2$/W) of the groove width $W_2$ and the tine width W is larger than 0.35 and less than 1, and a ratio ($t_1$/t) of the groove thickness $t_1$ and the thickness t of the tuning fork tines (tine thickness t) is less than 0.79, preferably, within a range of 0.01 to 0.79 to obtain very large moment of inertia of the tuning fork tines. That is to say, the flexural mode, quartz crystal tuning fork resonator, capable of vibrating in the fundamental mode, and having a high frequency stability can be provided with a small series resistance $R_1$, a high quality factor $Q_1$ and a small capacitance ratio $r_1$ because electromechanical transformation efficiency of the resonator becomes large markedly.

Likewise, length $l_1$ of the grooves 21 and 27 of the tines 20 and 26 extends into the base 40 in this embodiment (which has a dimension of the length $l_2$ and the length $l_3$ of the grooves). Therefore, groove length and length of the tuning fork tines are given by ($l_1$-$l_3$) and (l-$l_2$), respectively, and a ratio of ($l_1$-$l_3$) and (l-$l_2$) is within a range of 0.4 to 0.8 to get a flexural mode, quartz crystal tuning fork resonator with series resistance $R_1$ of a fundamental mode vibration smaller than series resistance $R_2$ of a second overtone mode vibration Furthermore, the total length l is determined by the frequency requirement and the size of the housing case. At the same time, to get a flexural mode, quartz crystal tuning fork resonator capable of vibrating easily in a fundamental mode with suppression of the second overtone mode vibration which is unwanted mode vibration, there is a close relationship between the groove length $l_1$ and the total length l. Namely, a ratio ($l_1$/l) of the groove length $l_1$ and the total length l is within a range of 0.2 to 0.78 because the quantity of charges which generate within the grooves and on the sides of the tuning fork tines or the tuning fork tines and the tuning fork base can be controlled by the ratio, as a result, the second overtone mode vibration can be suppressed substantially, and simultaneously, a frequency stability of the fundamental mode vibration gets high. Therefore, the flexural mode, quartz crystal tuning fork resonator, capable of vibrating easily in the fundamental mode and having the high frequency stability can be provided.

In more detail, series resistance $R_1$ of the fundamental mode vibration becomes smaller than series resistance $R_2$ of the second overtone mode vibration. Namely, $R_1<R_2$, preferably, $R_1<0.86R_2$, therefore, a quartz crystal oscillator (oscillator circuit) comprising an amplifier (CMOS inverter), capacitors, resistors (resistance elements) and a quartz crystal unit with the quartz crystal tuning fork resonator of this embodiment can be obtained, which is capable of vibrating in the fundamental mode very easily. In addition, in this embodiment the grooves 21 and 27 of the tines 20 and 26 extend into the base 40 in series, but embodiment of the present invention includes a plurality of grooves divided into the length direction of the tuning fork tines. In addition, the grooves may be constructed only at the tuning fork tines ($l_3=0$), as will be shown in FIG. 4.

In this embodiment, the groove length $l_1$ corresponds to electrode length disposed inside the grooves, though the electrode is not shown in FIG. 3, but, when the electrode length is less than the groove length, the length $l_1$ is of the electrode length. Namely, the ratio ($l_1/l$) in this case is expressed by a ratio of electrode length $l_1$ of the grooves and the total length l. Also, a fork portion of this embodiment has a rectangular shape, but this invention is not limited to this, for example, the fork portion may have a U shape.

In addition, a space of between the tuning fork tines is given by $W_4$, and in this embodiment, the space $W_4$ and the groove width $W_2$ are constructed so that $W_4 \geq W_2$, and more, the space $W_4$ is within a range of 0.05 mm to 0.35 mm and the width $W_2$ is within a range of 0.02 mm to 0.068 mm because it is easy to form a tuning fork shape and grooves of the tuning fork tines separately by a photo-lithographic process and an etching process, as a result, a frequency stability for a fundamental mode vibration gets higher than that for a second overtone mode vibration. In this embodiment, a quartz crystal wafer with the thickness t of 0.05 mm to 0.12 mm is used. But, it is possible to use the wafer thicker than 0.12 mm.

In more detail, to obtain a flexural mode, quartz crystal tuning fork resonator with a high frequency stability which gives high time accuracy, it is necessary to obtain the resonator whole resonance frequency is not influenced by shunt capacitance because quartz crystal is a piezoelectric material and the frequency stability is very dependent on the shunt capacitance. In order to decrease the influence on the resonance frequency by the shunt capacitance, figure of merit $M_i$ plays an important role. Namely, the figure of merit $M_i$ that expresses inductive characteristics, electromechanical transformation efficiency and a quality factor of a flexural mode, quartz crystal tuning fork resonator, is defined by a ratio ($Q_i/r_i$) of a quality factor $Q_i$ and capacitance ratio $r_i$, namely, $M_i$ is given by $M_i=Q_i/r_i$, where i shows vibration order of a quartz crystal tuning fork resonator, and for example, when i=1 and 2, figures of merit $M_1$ and $M_2$ are for a fundamental mode vibration and a second overtone mode vibration, respectively.

Also, a frequency difference $\Delta f$ of resonance frequency $f_s$ of mechanical series independent on the shunt capacitance and resonance frequency $f_r$ dependent on the shunt capacitance is inversely proportional to the figure of merit $M_i$. The larger the value $M_i$ becomes, the smaller the difference $\Delta f$ becomes. Namely, the influence on the resonance frequency $f_r$ by the shunt capacitance decreases because it is close to the resonance frequency $f_s$. Accordingly, the larger the $M_i$ becomes, the higher the frequency stability of the flexural mode, quartz crystal tuning fork resonator becomes because the resonance frequency $f_r$ of the resonator is almost never dependent on the shunt capacitance whose value changes with time. Namely, the flexural mode, quartz crystal tuning fork resonator can be provided with a high time accuracy.

In detail, a quartz crystal tuning fork resonator capable of vibrating in a flexural mode can be obtained with figure of merit $M_1$ of a fundamental mode vibration larger than figure of merit $M_2$ of a second overtone mode vibration by the above-described tuning fork shape, grooves and dimensions. That is to say, $M_1>M_2$. As an example, when resonance frequency of a quartz crystal tuning fork resonator is about 32.768 kHz for a fundamental mode vibration and the resonator has a value of $W_2/W=0.5$, $t_1/t=0.34$ and $l_1/l=0.48$, though there is a distribution in production, the quartz crystal tuning fork resonator has a value of $M_1>65$ and $M_2<30$, respectively.

Namely, the flexural mode, quartz crystal tuning fork resonator which is capable of vibrating in the fundamental mode can be provided with high inductive characteristics, good electromechanical transformation efficiency (small capacitance ratio $r_1$ and small series resistance $R_1$) and a high quality factor. As a result, a frequency stability of the fundamental mode vibration becomes higher than that of the second overtone mode vibration, and simultaneously, the second overtone mode vibration can be suppressed because capacitance ratio $r_2$ and series resistance $R_2$ of the second overtone mode vibration become larger than capacitance ratio $r_1$ and series resistance $R_1$ of the fundamental mode vibration, respectively.

Therefore, the resonator capable of vibrating in the fundamental mode vibration can be provided with a high time accuracy because it has the high frequency stability. Consequently, a quartz crystal oscillating circuit comprising the flexural mode, quartz crystal tuning fork resonator of this embodiment outputs a frequency of the fundamental mode vibration as an output signal, and the frequency of the output signal has a very high stability, namely, an excellent time accuracy. In other words, the quartz crystal oscillator of this embodiment has a remarkable effect such that a frequency change by ageing becomes very small. Also, a frequency of a fundamental mode vibration of the present invention is less than 200 kHz, preferably, within a range of 10 kHz to 200 kHz. Especially, 32.768 kHz is used widely.

In addition, groove length $l_1$ of the present invention is length of grooves constructed at tuning fork tines so that the ratio ($t_1/t$) of the groove thickness $t_1$ and the tine thickness t is less than 0.79, and the ratio ($W_2/W$) of the groove width $W_2$ and the tine width W is larger than 0.35 and less than 1, when the grooves are constructed only at the tuning fork tines, and also, when the grooves constructed at the tuning fork tines extend into a tuning fork base and at least one groove is constructed between the grooves extended into the tuning fork base, groove length $l_1$ of the present invention is length of grooves constructed at the tuning fork tines and the tuning fork base (groove length $l_3$).

Namely, when the grooves constructed at the tuning fork tines extend into the tuning fork base and at least one groove is not constructed between the grooves extended into the tuning fork base, the groove length $l_1$ of the present invention is length of grooves constructed at the tuning fork tines. Also, when the grooves of the tines are divided into the length direction thereof or connected via at least one step portion, the groove length $l_1$ is total length of the length direction satisfying the ratios ($t_1/t$) and ($W_2/W$) described above. In addition, the groove thickness $t_1$ of the present invention is the thinnest thickness of the grooves because quartz crystal is an anisotropic material and the groove thickness $t_1$ has a distribution when it is formed by a chemical etching method.

Figure 4:
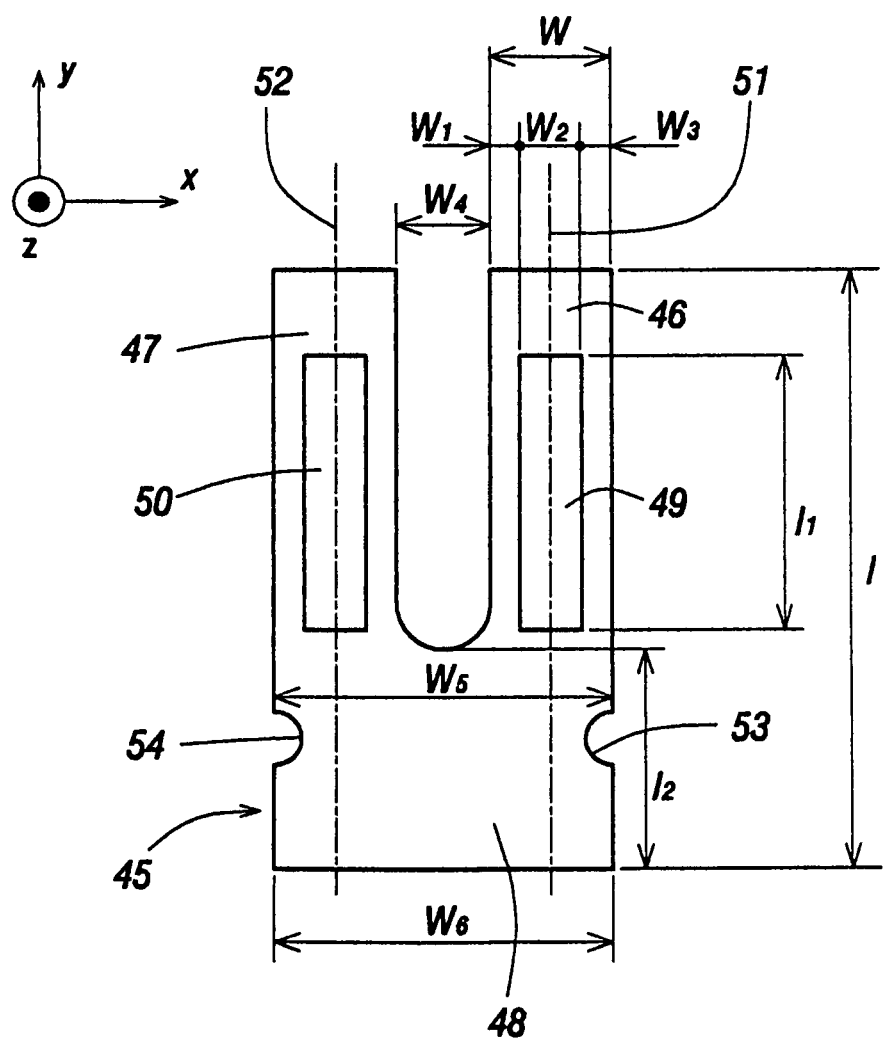
FIG. 4 shows a plan view of a flexural mode, quartz crystal tuning fork resonator embodying the present invention.

FIG. 4 shows a plan view of a flexural mode, quartz crystal tuning fork resonator 45 embodying the present invention. The resonator 45 comprises tuning fork tines 46, 47 and a tuning fork base 48. The tines 46, 47 and the base 48 are formed integrally by a chemical etching process. In this embodiment, the base 48 has cut portions 53 and 54. Also, a groove 49 is constructed to include a portion of the central line 51 of the tine 46, a groove 50 is similarly constructed to include a portion of the central line 52 of the tine 47. In this embodiment, the grooves 49 and 50 are constructed at a part of the tines 46 and 47, and have groove width $W_2$ and groove length $l_1$.

In this embodiment, though electrodes are not shown in FIG. 4, the electrodes are disposed inside the grooves 49, 50 and on sides of the tuning fork tines 46 and 47, similar to FIG. 2. In detail, the electrodes are disposed opposite each other inside the grooves and on the sides of the tuning fork tines so that the electrodes disposed opposite each other are of opposite electrical polarity and the tuning fork tines are capable of vibrating in inverse phase.

Also, in this embodiment, the width $W_2$ of the grooves 49 and 50 (groove width $W_2$) which include a portion of the central lines 51 and 52, respectively, is preferable because moment of inertia of the tines 46 and 47 becomes large and the tines are capable of vibrating in a flexural mode very easily. Also, though grooves of reverse face of the tines are not shown in FIG. 4, the grooves are constructed opposite each other to the grooves 49 and 50 at the reverse face of the tines 46 and 47, and electrodes are disposed inside the grooves and on sides of the tines, similar to FIG. 2.

In addition, the base 48 has cut portions 53 and 54, and the cut base 48 has a dimension of width $W_5$ (tines side) and width $W_6$ (opposite side to the tines side). When the base 48 is mounted at a mounting portion of a case of surface mounting type or tubular type by solder or conductive adhesives, it is necessary to satisfy $W_6 \geq W_5$ to decrease energy losses by vibration. The cut portions 53 and 54 are very effective to decrease the energy losses. Therefore, the flexural mode, quartz crystal tuning fork resonator, capable of vibrating in the fundamental mode and having the high frequency stability (high time accuracy) can be provided with a small series resistance $R_1$ and a high quality factor $Q_1$. Also, the width dimensions $W=W_1+W_2+W_3$ and $W_a$, and the length dimensions $l_1$, $l_2$ and $l$ are as already described in relation to FIG. 3.

Figure 5A:
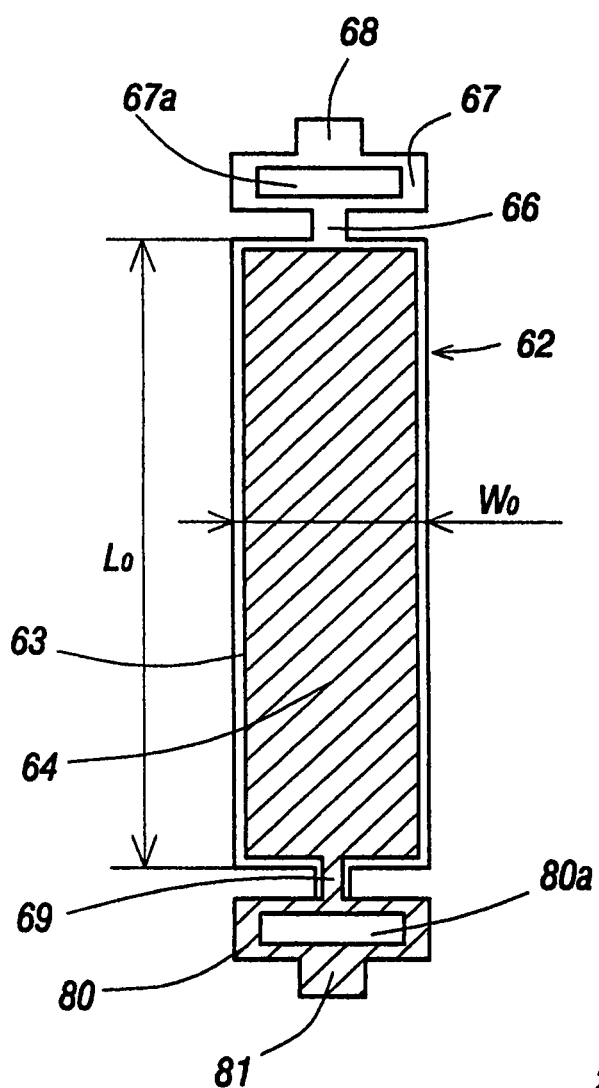
FIG. 5a and FIG. 5b show a plan view and a side view of a contour mode quartz crystal resonator capable of vibrating in a width-extensional mode embodying the present invention.
Figure 5B:
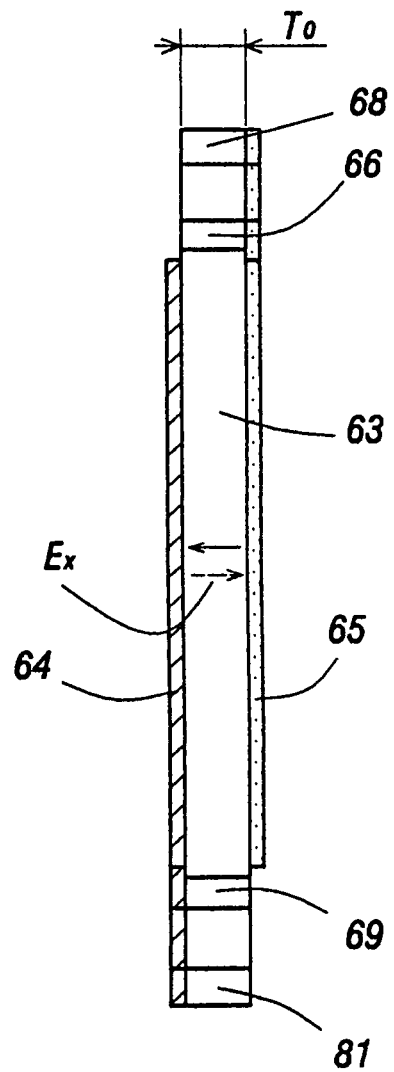
Figure 5B:
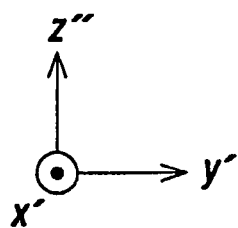

FIG. 5a and FIG. 5b are a plan view and a side view of a contour mode quartz crystal resonator capable of vibrating in a width-extensional mode embodying the present invention, so called a width-extensional mode quartz crystal resonator 62. The resonator 62 comprises vibrational portion 63, connecting portions 66, 69 and supporting portions 67, 80 including respective mounting portions 68, 81. In addition, the supporting portions 67 and 80 have respective holes 67a and 80a. Also, electrodes 64 and 65 are disposed opposite each other on upper and lower faces of the vibrational portion 63, the electrodes have opposite electrical polarities. Namely, a pair of electrodes is disposed on the vibrational portion. In this case, a fundamental mode vibration can be excited easily.

In addition, the electrode 64 extends to the mounting portion 81 through the one connecting portion 69 and the electrode 65 extends to the mounting portion 68 through the other connecting portion 66. In this embodiment, the electrodes 64 and 65 disposed on the vibrational portion 63 extend to the mounting portions of the different direction each other. However, a resonator with the same characteristics as said resonator can be obtained, even if the electrodes 64 and 65 extend to the mounting portions of the same direction each other. The resonator in this embodiment is mounted on fixing portions of a case or a lid at the mounting portions 68 and 81 by conductive adhesives or solder.

With respect to a cutting angle of the width-extensional mode quartz crystal resonator, it is shown here. First, a quartz crystal plate perpendicular to x axis, so called, X plate quartz crystal is taken. Width $W_0$, length $L_0$ and thickness $T_0$ which are each dimension of the X plate quartz crystal correspond to the respective directions of y, z and x axes.

Next, this X plate quartz crystal is, first, rotated with an angle $\theta_x$ of $-25°$ to $+25°$ about the x axis, and second, rotated with an angle $\theta_y$ of $-30°$ to $+30°$ about y' axis which is the new axis of the y axis. In this case, the new axis of the x axis changes to x' axis and the new axis of the z axis changes to z" axis because the z axis is rotated twice about two axes. the width-extensional mode quartz crystal resonator of the present invention is formed from the quartz crystal plate with the rotation angles.

In other words, according to an expression of IEEE notation, a cutting angle of the width-extensional mode quartz crystal resonator of the present invention can be expressed by XZtw(−25°-+25°)/(−30°-+30°). Also, when a turn over temperature point $T_p$ is taken in a vicinity of room temperature, a cutting angle of the quartz crystal resonator may be within a range of XZt(−12°--13.5°) or XZt(−18.5°--19.8°) or XZtw (−13°-−18°)/±(+0.5°-+30°). Namely, said three kinds of cutting angles in this embodiment is in the same direction as the cutting angle of the DT cut quartz crystal resonator, which is formed from a rotated Y-plate about the x axis whose Y-plate is perpendicular to the y axis.

Moreover, the vibrational portion 63 has a dimension of width $W_0$, length $L_0$ and thickness $Z_0$, also, width $W_0$, length $L_0$ and thickness $T_0$ correspond to y', z" and x' axes, respectively. That is, the electrodes 64 and 65 are disposed on the upper and lower faces of the vibrational portion 63 perpendicular to the x' axis.

In addition, the vibrational portion 63 has a dimension of length $L_0$ greater than width $W_0$ and thickness $T_0$ smaller than the width $W_0$. Namely, a coupling between a width-extensional mode and a length-extensional mode gets so small as it can be ignored, as a result of which, the quartz crystal resonator can vibrate in a single width-extensional mode, and also, a width-to-length ratio ($W_0/L_0$) has a value smaller than 0.7 to provide the resonator with a small series resistance $R_1$ by increasing electrode area of the vibrational portion. In addition, a thickness-to-width ratio ($T_0/W_0$) has a value smaller than 0.85 to provide the resonator with a small $R_1$ by increasing the intensity of an electric field $E_x$, These actual dimensions are, therefore, determined by the requirement characteristics for the width-extensional mode quartz crystal resonator.

In more detail, resonance frequency of the width-extensional mode quartz crystal resonator is inversely proportional to width $W_0$, and it is almost independent on such an other dimension as length $L_0$, thickness $T_0$, connecting portions and supporting portions. Also, in order to obtain a width-extensional mode quartz crystal resonator with a frequency of 4 MHz, the width $W_0$ is about 0.7 mm. Thus, the miniature width-extensional mode quartz crystal resonator can be provided with a frequency less than 135 MHz, preferably, within a range of 1 MHz to 135 MHz because resonance frequency of the resonator is inversely proportional to the width $W_0$. Also, the resonator capable, of vibrating in a single width-extensional mode can be obtained from the relation of said dimensions.

Consequently, a quartz crystal oscillator comprising a quartz crystal oscillating circuit comprising the resonator of this embodiment having a high electromechanical transformation efficiency can be provided with a small series resistance $R_1$ and a high quality factor Q. Also, the quartz crystal oscillating circuit comprises an amplification circuit comprising an amplifier at least and a feedback circuit comprising the quartz crystal resonator and capacitors at least. In detail, the amplification circuit comprises a CMOS inverter and a feedback resistor and the feedback circuit comprises a drain resistor, the resonator, a capacitor of a gate side and a capacitor of a drain side. Therefore, an output signal of the quartz crystal oscillator of this embodiment is used as a clock signal.

Now, when an alternating current (AC) voltage is applied between the electrodes 64 and 65 shown in FIG. 5b, an electric field $E_x$ occurs alternately in the thickness direction, as shown by the arrow direction of the solid and broken lines. Consequently, the vibrational portion 63 is capable of extending and contracting in the width direction. In this embodiment, though the width-extensional mode quartz crystal resonator is described in detail, which is one of a contour mode quartz crystal resonator, this invention is not limited to this, but includes a length-extensional mode quartz crystal resonator and a Lame mode quartz crystal resonator, each of which is capable of vibrating in a contour mode, and has a vibrational portion, connecting portions and supporting portions respectively.

Especially, for the Lame mode quartz crystal resonator, the vibrational portion and the supporting portions are connected at corners of the vibrational portion through the connecting portions and electrodes are disposed opposite each other on upper and lower faces of the vibrational portion so that the electrodes opposite each other are of opposite electrical polarity. Also, the length-extensional mode quartz crystal resonator of the present invention can be obtained by replacing the width with the length and the length with the width of the width-extensional mode quartz crystal resonator. Therefore, the connecting portions and the supporting portions are constructed in the width direction and the connecting portions are connected at ends of the vibrational portion.

Figure 6:
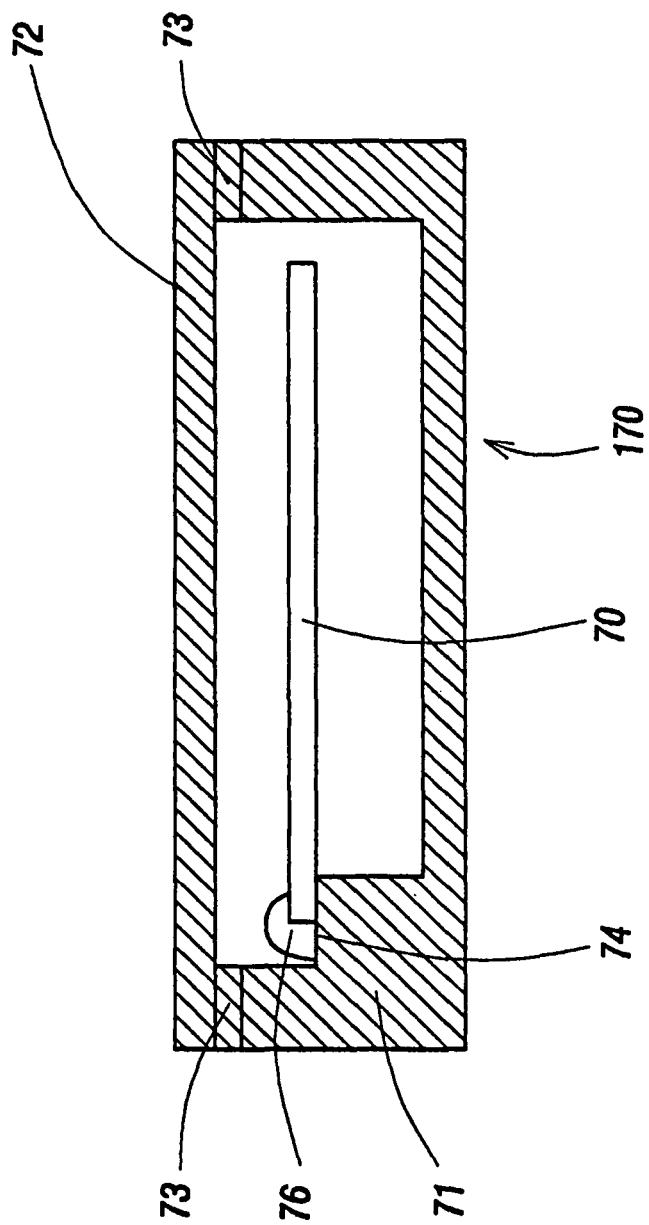
FIG. 6 shows a cross-sectional view of a quartz crystal unit embodying the present invention, and in which a quartz crystal tuning fork resonator is housed.

FIG. 6 shows a cross-sectional view of a quartz crystal unit embodying the present invention. In this embodiment, the quartz crystal unit 170 comprises a flexural mode, quartz crystal tuning fork resonator 70, a case 71 and a lid 72. In more detail, the resonator 70 is mounted at a mounting portion 74 of the case 71 by conductive adhesives 76 or solder. Also, the case 71 and the lid 72 are connected through a connecting member 73. The resonator 70 in this embodiment is the same resonator as one of the flexural mode, quartz crystal tuning fork resonators 10 and 45 described in detail in FIG. 1-FIG. 4. Also, in this embodiment, circuit elements are connected at outside of the quartz crystal unit to get a quartz crystal oscillator. Namely, only the quartz crystal tuning fork resonator is housed in the unit (package) and also, it is housed in the unit in vacuum. In this embodiment, the quartz crystal unit of surface mounting type is shown, but the quartz crystal tuning fork resonator may be housed in a unit of tubular type. For example, when a quartz crystal tuning fork resonator is housed in the unit of tubular type, a case has two lead wires as a mounting portion and the resonator is mounted on the two lead wires. This is called a quartz crystal unit of tubular type.

In this embodiment, the quartz crystal unit comprises the flexural mode, quartz crystal tuning fork resonator, but may comprise the length-extensional mode quartz crystal resonator or the Lame mode quartz crystal resonator described above in detail, instead of the tuning fork resonator.

In addition, a member of the case and the lid is ceramics or glass and a metal or glass, respectively, and a connecting member is a metal or glass with low melting point. Also, a relationship of the resonator, the case and the lid described in this embodiment is applied to a quartz crystal oscillator of the present invention which will be described in FIG. 10

Next, a method for manufacturing a quartz crystal resonator, a quartz crystal unit and a quartz crystal oscillator of the present invention is described in detail, according to the manufacturing steps.

Figure 7:
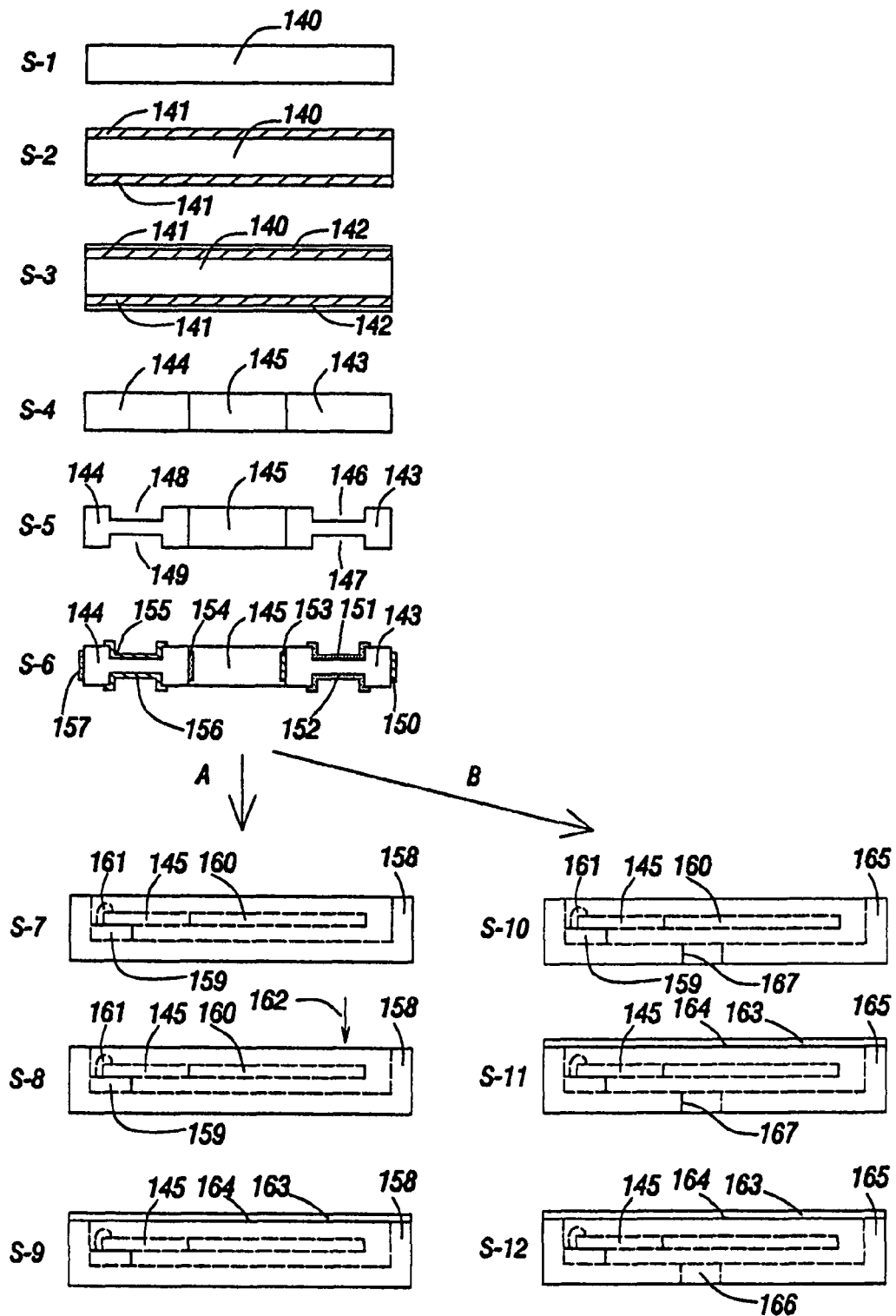
FIG. 7 shows a step diagram of a method for manufacturing a quartz crystal tuning fork resonator and a quartz crystal unit of the present invention.

FIG. 7 shows an embodiment of a method for manufacturing a quartz crystal resonator, a quartz crystal unit and a quartz crystal oscillator of the present invention and a step diagram embodying the present invention. In this embodiment, a quartz crystal tuning fork resonator capable of vibrating in a flexural mode is described. The signs of S-1 to S-12 are the step numbers. First, S-1 shows a cross-sectional view of a quartz crystal wafer 140. Next, in S-2 metal film 141, for example, chromium and gold on the chromium are, respectively, disposed on upper and lower faces of the quartz crystal wafer 140 by an evaporation method or a spattering method. In addition, resist 142 is spread on said metal film 141 in S-3, and after the metal film 141 and the resist 142 were removed except those of tuning fork shape by a photo-lithographic process and an etching process, the tuning fork shape having tuning fork tines 143, 144 and a tuning fork base 145, as be shown in S-4, is integrally formed by a chemical etching process. In S-4, the resist and the metal film disposed on the tuning fork shape are removed after it was formed. When the tuning fork shape is formed, cut portions may be formed at the tuning fork base. In FIG. 7 the formation of a piece of tuning fork shape is shown, but, a plurality of individual tuning fork shapes are actually formed in a quartz crystal wafer.

Similar to the steps of S-2 and S-3, metal film and resist are spread again on the tuning fork shape of S-4 and grooves 146, 147, 148 and 149 each of which has two step difference portions along the length direction of the tuning fork tines, are formed at the tuning fork tines 143, 144 by a photo-lithographic process and an etching process, and the shape of S-5 is obtained after all of the resist and the metal film were removed. In addition, metal film and resist are spread again on the shape of S-5 and electrodes which are of opposite electrical polarity, are disposed opposite each other on sides of the tuning fork tines and inside the grooves thereof, as be shown in S-6.

Namely, electrodes 150, 153 disposed on the sides of the tuning fork tine 143 and electrodes 155, 156 disposed inside the grooves 148, 149 of the tuning fork tine 144 have the same electrical polarity. Similarly, electrodes 151, 152 disposed inside the grooves 146, 147 of the tuning fork tine 143 and electrodes 154, 157 disposed on the sides of the tuning fork tine 144 have the same electrical polarity. Two electrode terminals are, therefore, constructed. In more detail, when an alternating current (AC) voltage is applied between the terminals, the tuning fork tines are capable of vibrating in a flexural mode of inverse phase because said electrodes disposed on step difference portions of the grooves and the electrodes disposed opposite to the said electrodes have opposite electrical polarity. In the step of S-6, a piece of flexural mode, quartz crystal tuning fork resonator capable of vibrating in a fundamental mode is shown in the quartz crystal wafer, but a plurality of individual quartz crystal tuning fork resonators, each of which comprises tuning fork tines and a tuning fork base capable of vibrating in a flexural mode and has resonance frequency higher than 32.768 kHz in the fundamental mode vibration, are actually formed in the quartz crystal wafer.

Next, metal films are formed on the tuning fork tines of the individual quartz crystal tuning fork resonators in the quartz crystal wafer by a spattering method or an evaporation method so as to get the individual quartz crystal tuning fork resonators each of which has resonance frequency lower than 32.768 kHz, preferably, within a range of 29.4 kHz to 32.75 kHz.

In addition, resonance frequency for the individual resonators is adjusted by a separate step of at least twice and the first adjustment of resonance frequency for the individual resonators is performed in the quartz crystal wafer by laser trimming or a plasma etching method so that the resonance frequency of the individual resonators is within a range of 32.2 kHz to 33.08 kHz. The adjustment of frequency by laser trimming or a plasma etching method is performed by trimming the metal films disposed on the tuning fork tines to increase the resonance frequency, on the other hand, the adjustment of frequency by an evaporation method is performed by adding mass such as a metal on tuning fork tines to decrease the resonance frequency. Namely, those methods can change the resonance frequency of the resonators. Also, the individual resonators formed in the quartz crystal wafer are inspected therein and when there is a failure resonator, it is removed from the quartz crystal wafer or something is marked on it or it is remembered by a computer.

In this embodiment, the tuning fork shape is formed from the step of S-3 and after that, the grooves are formed at the tuning fork tines, namely, the tuning fork tines are formed before the grooves are formed, but this invention is not limited to said embodiment, for example, the grooves are first formed from the step of S-3 and after that, the tuning fork shape may be formed, namely, the grooves are formed before the tuning fork tines are formed. Also, the tuning fork shape and the grooves may be formed simultaneously, namely, the tuning fork tines and the grooves are formed simultaneously. In addition, the grooves each of which has two step difference portions along the direction of length of the tuning fork tines, are formed in this embodiment, but, each of the grooves may have step difference portions more than two along the length direction of the tines, at least two of which are connected via at least one step portion.

Also, in this embodiment, though the grooves are constructed at the tuning fork tines and the electrodes are disposed inside the grooves, this invention is not limited to this, namely, the grooves may not be constructed at the tuning fork tines. In more detail, the tuning fork tines have obverse and reverse faces and sides and electrodes are disposed on the obverse and reverse faces and the sides of the tines. In addition, electrodes disposed on obverse and reverse faces of tuning fork tines of the present invention implies electrodes disposed on the obverse and reverse faces of the tuning fork tines, notwithstanding there is a groove at the tines or not. Therefore, it is needless to say that this invention includes at least one connecting electrode disposed on at least one face of the obverse and reverse faces of the tines to connect two electrodes. As a result of which the tuning fork tines are capable of vibrating in inverse phase.

There are two methods of A and B in the following step, as be shown by arrow signs. For the step of A, the tuning fork base 145 of the formed flexural mode, quartz crystal tuning fork resonator 160 is first mounted on mounting portion 159 of a case 158 by conductive adhesives 161 or solder, as be shown in S-7. Next, the second adjustment of resonance frequency for the resonator 160 is performed by laser 162 or an evaporation method or a plasma etching method in S-8 so that the resonance frequency is within a range of 32.764 kHz to 32.772 kHz when the resonator is housed in a package, namely, the quartz crystal unit is provided. Finally, the case 158 and a lid 163 are connected via glass 164 with the low melting point or a metal in S-9. In this case, the connection of the case and the lid is performed in vacuum because the case 158 has no hole to close it in vacuum.

In this embodiment, though the metal films are formed on the tuning fork tines of the individual quartz crystal resonators formed in the quartz crystal wafer and resonance frequency of the individual resonators is adjusted therein by removing a part or all of the metal films by laser trimming or a plasma etching method, the present invention is not limited to this, namely, said steps may be omitted. In more detail, each of the individual resonators having resonance frequency higher than 32.768 kHz is mounted at a mounting portion of a case and after that, the resonance frequency is adjusted by an evaporation method so that it is within a range of 32.764 kHz to 32.772 kHz when a quartz crystal unit is provided.

In addition, though it is not visible in FIG. 7, the third frequency adjustment may be performed by laser trimming after the step of the connection of S-9 to get a small frequency deviation when a material of the lid is glass. As a result of which it is possible to get the resonator with the resonance frequency of 32.766 kHz to 32.77 kHz. Like this step, when the third frequency adjustment is performed, the resonance frequency of the resonators by the second frequency adjustment is adjusted so that it is within a range of 32.736 kHz to 32.8 kHz.

For the step of B, the tuning fork base 145 of the formed resonator 160 is first mounted on mounting portion 159 of a case 165 by conductive adhesives 161 or solder in S-10, in addition, in S-11 the case 165 and a lid 163 are connected by the same way as that of S-9, in more detail, after the resonator was mounted on the mounting portion of the case or after the resonator was mounted at the mounting portion and the case and the lid were connected, the second adjustment of resonance frequency is performed so that the resonance frequency is within a range of 32.764 kHz to 32.772 kHz in vacuum, but, it may be within a wider range, for example, 32.736 kHz to 32.8 kHz when the third frequency adjustment as will be shown as follows, is performed. Finally, a hole 167 constructed at the case 165 is closed in vacuum using such a metal 166 as solder or glass with the low melting point in S-12.

Also, similar to the step of A, the third adjustment of resonance frequency may be performed by laser trimming after the step of S-12 to get a small frequency deviation. As a result of which it is possible to get the resonator with the resonance frequency of 32.766 kHz to 32.77 kHz. Thus, the resonance frequency of the resonators in the case of A and B is finally within a range of 32.764 kHz to 32.772 kHz at most. Also, the second frequency adjustment may be performed after the case and the lid were connected and after that, the hole is closed in vacuum. In addition, the hole is constructed at the case, but may be constructed at the lid. Also, the frequency adjustment of the present invention is performed in vacuum or inert gas such as nitrogen gas or atmosphere, and the values described above are values in vacuum.

Therefore, the quartz crystal tuning fork resonators each of which is capable of vibrating in a flexural mode and the quartz crystal units manufactured by the above-described method are miniaturized and realized with a small series resistance $R_1$, a high quality factor $Q_1$ and low price.

Moreover, in the above-described embodiment, though the first frequency adjustment of the resonators is performed in the quartz crystal wafer and at the same time, when there is a failure resonator, something is marked on it or it is removed from the quartz crystal wafer, but the present invention is not limited to this, namely, the present invention may include the step to inspect the flexural mode, quartz crystal tuning fork resonators formed in the quartz crystal wafer therein, in other words, the step to inspect whether there is a failure resonator or not in the quartz crystal wafer. When there is the failure resonator in the wafer, it is removed from the wafer or something is marked on it or it is remembered by a computer. By including the step, it can increase a manufacturing yield of the quartz crystal resonators because it is possible to find out the failure resonator in an early step and the failure resonator does not go to the next step. As a result of which low priced flexural mode, quartz crystal tuning fork resonators can be provided with excellent electrical characteristics. In this embodiment, the frequency adjustment is performed three times by a separate step, but may be performed at least twice by a separate step. For example, the third frequency adjustment may be omitted.

In this embodiment, the frequency adjustment is performed by a separate step of at least twice. However, when a plurality of individual quartz crystal tuning fork resonators, each of which has a resonance frequency higher than 32.768 kHz, are formed in a quartz crystal wafer and each resonator is mounted at a mounting portion of a case or a lid, resonance frequency is adjusted by an evaporation method of at least once so that it is within a range of 32.764 kHz to 32.772 kHz when a quartz crystal unit is provided.

Also, for the manufacturing method of this embodiment, the steps of forming a plurality of individual quartz crystal tuning fork resonator having resonance frequency higher than 32.768 kHz by a chemical etching method and changing the resonance frequency by forming metal films on tuning fork tines of the individual resonators are not included in the frequency adjustment of the present invention.

In addition, in order to construct a quartz crystal oscillator comprising: a quartz crystal oscillating circuit comprising; an amplification circuit comprising an amplifier at least and a feedback circuit comprising a quartz crystal tuning fork resonator capable of vibrating in a flexural mode, and capacitors at least, two electrode terminals of the resonators are connected electrically to the amplifier and the capacitors at least. Namely, the quartz crystal oscillating circuit comprises the step of connecting electrically the quartz crystal tuning fork resonator, the amplifier and the capacitors at least, In more detail, the quartz crystal oscillating circuit is constructed and connected electrically so that the amplification circuit comprises a CMOS inverter and a feedback resistor and the feedback circuit comprises the flexural mode, quartz crystal tuning fork resonator, the drain resistor, the capacitor of a gate side and the capacitor of a drain side. Also, the third frequency adjustment may be performed after the quartz crystal oscillating circuit was constructed.

Next, an embodiment of a method for manufacturing a quartz crystal unit comprising a contour mode quartz crystal resonator such as a width-extensional mode quartz crystal resonator, a length-extensional mode quartz crystal resonator and a Lame mode quartz crystal resonator, a case and a lid is described in detail, the contour mode quartz crystal resonator comprises the step of: utilizing a particle method or a chemical etching method to form a resonator comprising; a vibrational portion; connecting portions located at ends of said vibrational portion; supporting portions connected to the vibrational portion through the connecting portions; and electrodes disposed opposite each other on upper and lower faces of the vibrational portion so that the electrodes disposed opposite each other are of opposite electrical polarity.

In addition, a plurality of individual quartz crystal resonators each of which is capable of vibrating in a contour mode and a single mode, are formed in a quartz crystal wafer with resonance frequency higher than a nominal frequency, and, metal films are formed on the vibrational portion in the quartz crystal wafer by a spattering method or an evaporation method so as to get the individual quartz crystal resonators each of which has resonance frequency lower than the nominal frequency.

Moreover, each of the individual quartz crystal resonators is housed in a case, and the resonance frequency of each resonator is adjusted by removing a part or all of the metal films formed on the vibrational portion by laser trimming or a plasma etching method so that a frequency deviation is within a range of −100 PPM to +100 PPM to the nominal frequency. Namely, the resonator is housed in a package with the frequency deviation.

In this embodiment, the metal films are formed on the vibrational portion, but they may not be formed on the vibrational portion. In this case, a plurality of individual contour mode quartz crystal resonators each of which is capable of vibrating in a contour mode and a single mode, are formed in a quartz crystal wafer with resonance frequency lower than a nominal frequency, and each of the individual quartz crystal resonators is loused in a case, and the resonance frequency of each resonator is adjusted by removing a part of the electrodes formed on the vibrational portion by laser trimming or a plasma etching method so that a frequency deviation is within a range of −100 PPM to +100 PPM to the nominal frequency. Namely, the resonator is housed in a package with the frequency deviation.

As described above, the contour mode quartz crystal resonators in the embodiment have such complicated shapes as comprise the vibrational portion, the connecting portions and the supporting portions. Also, the resonators in this embodiment of the present invention are generally processed by a chemical etching method, but, when the etching speed which is very dependent on a cutting angle is extremely slow, it is very difficult and impossible to process the resonators by the chemical etching method. In this case, the resonators in this embodiment of the present invention are, therefore, processed by a physical method or a mechanical method, and the resonators are formed integrally by at least one method.

Namely, particles with mass are collided with a quartz crystal plate covered by resist corresponding to the shape of resonators by the physical or mechanical method, as a result of which, the shape of the resonators is processed because atoms or molecules of the quartz crystal plate scatter. This method is called "particle method" here. This method is, substantially, different from the chemical etching method and at the same time, it has a feature that the processing speed is also very fast.

According to this particle method, low priced quartz crystal resonators can be provided similar to the chemical etching method because the processing time of outward shapes for the resonators shorten extremely. For this particle method, resist with elastic characteristics is used to prevent the resist from defacement by particles, as the resist, for example, plastic resist for use in blast processing is well known. Also, for this particle method, for example, it is preferable to use particles of GC#1000 to GC#6000 or ion atoms or ion molecules as the particles for use in processing. Especially, a method by ion etching is called "plasma etching method" in the present invention.

Additionally, an insulation material such as $S_iO_2$ may be constructed on obverse and reverse faces of the width $W_1$ and the width $W_3$ of the tuning fork tines to prevent a short circuit of between the electrodes of the sides and the grooves thereof, and the insulation material is formed by a spattering method or an evaporation method. Also, when a tuning fork shape comprising tuning fork tines and a tuning fork base is formed by a photo-lithographic process and an etching process, cut portions may be also formed simultaneously at the tuning fork base.

Likewise, in the present embodiments the flexural mode quartz crystal resonator of tuning fork type has two tuning fork tines, but embodiments of the present invention include tuning fork tines more than two. In addition, the quartz crystal tuning fork resonators of the present embodiments are housed in a package (unit) of surface mounting type comprising a case and a lid, but may be housed in a package of tubular type.

Figure 8:
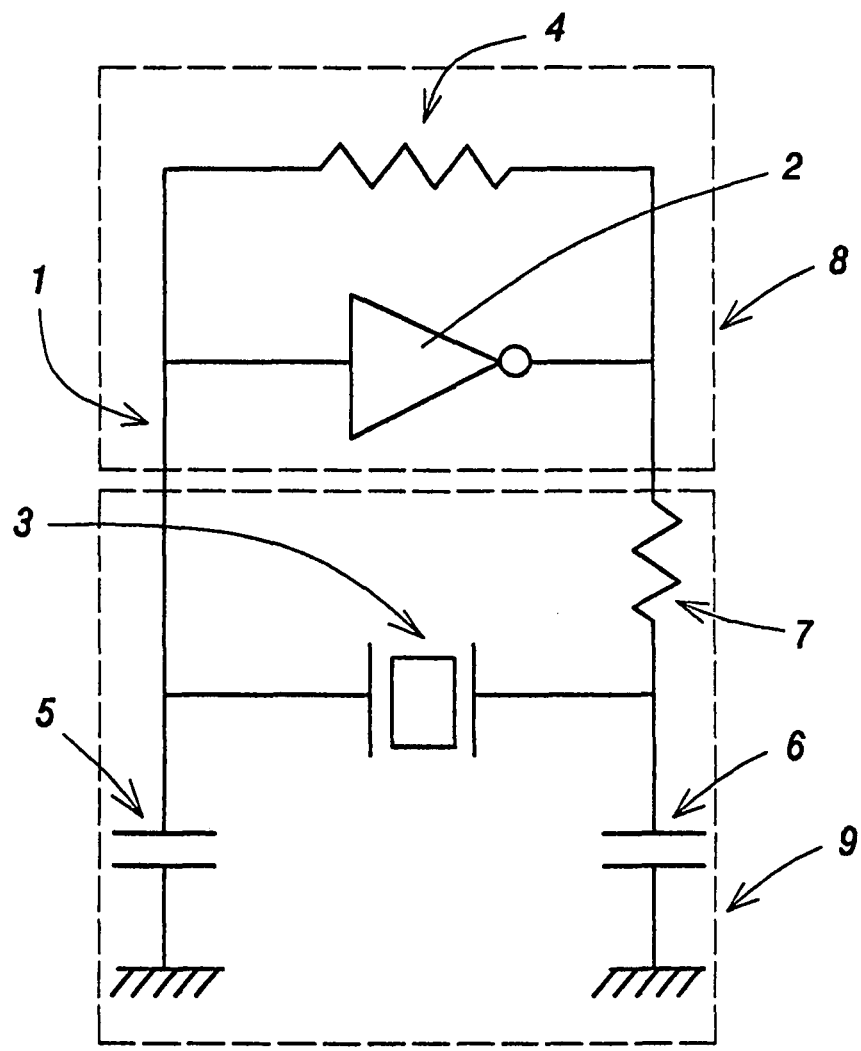
FIG. 8 shows a diagram of an embodiment of a quartz crystal oscillating circuit which constructs a quartz crystal oscillator of the present invention.

FIG. 8 shows a diagram of an embodiment of a quartz crystal oscillating circuit constructing a quartz crystal oscillator of the present invention. In this embodiment, the quartz crystal oscillating circuit 1 comprises an amplifier (CMOS Inverter) 2, a feedback resistor 4, drain resistor 7, capacitors 5, 6 and a flexural mode, quartz crystal tuning fork resonator 3. Namely, the quartz crystal oscillating circuit 1 comprises an amplification circuit 8 having the amplifier 2 and the feedback resistor 4, and a feedback circuit 9 having the drain resistor 7, the capacitors 5, 6 and the flexural mode quartz crystal resonator 3. In addition, an output signal of the quartz crystal oscillating circuit 1 comprising the flexural mode, quartz crystal tuning fork resonator 3, capable of vibrating in a fundamental mode, is outputted through a buffer circuit (not shown in FIG. 8) from a drain side of the amplifier (CMOS Inverter).

In detail, a frequency of the fundamental mode vibration is outputted through a buffer circuit as an output signal. According to the present invention, a nominal frequency of the fundamental mode vibration is 32.768 kHz. Also, the present invention includes a divided frequency of the output signal having the frequency of 32.764 kHz to 32.772 kHz by a divided circuit. In more detail, the quartz crystal oscillator in this embodiment comprises the quartz crystal oscillating circuit and the buffer circuit, in other words, the quartz crystal oscillating circuit comprises the amplification circuit and the feedback circuit, and the amplification circuit comprises the amplifier at least and the feedback circuit comprises the flexural mode, quartz crystal tuning fork resonator and the capacitors at least. Also, the quartz crystal tuning fork resonators each of which is capable of vibrating in a flexural mode have been already described in FIG. 1-FIG. 4 in detail.

Figure 9:
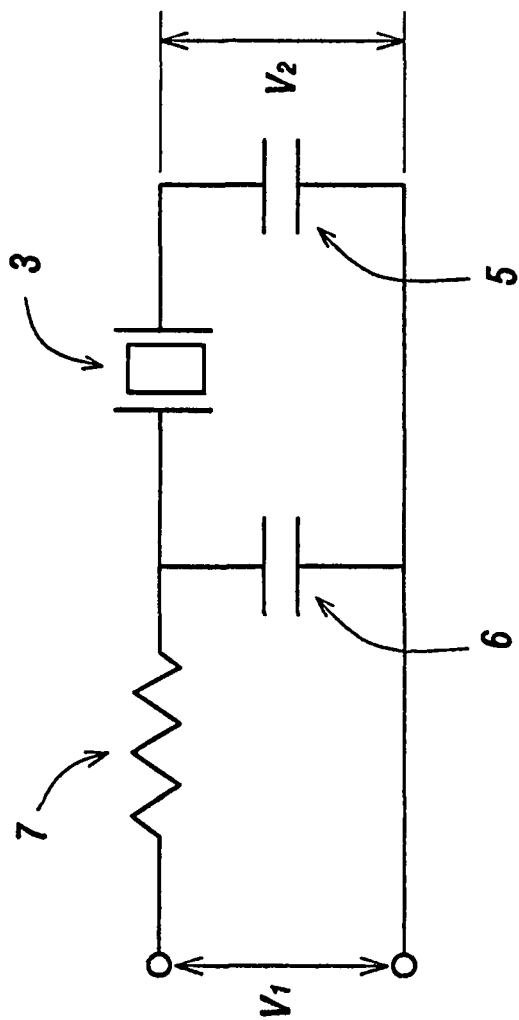
FIG. 9 shows a diagram of the feedback circuit of FIG. 8.

FIG. 9 shows a diagram of the feedback circuit of FIG. 8. Now, when angular frequency $\omega_i$ of the flexural mode, quartz crystal tuning fork resonator 3, capable of vibrating in a flexural mode, a resistance $R_d$ of the drain resistor 7, capacitance $C_g$, $C_d$ of the capacitors 5, 6, crystal impedance $R_{ei}$ of the quartz crystal resonator 3, an input voltage $V_1$, and an output voltage $V_2$ are taken, a feedback rate $\beta_i$ is defined by $\beta_i = |V_2|_i / |V_1|_i$, where i shows vibration order, for example, when i=1 and 2, they are for fundamental mode vibration and second overtone mode vibration, namely, when i=n, it is for $n^{th}$ overtone mode vibration.

In addition, load capacitance $C_L$ is given by $C_L = C_g C_d / (C_g + C_d)$, and when $C_g = C_d = C_{gd}$ and $Rd \gg R_{ei}$, the feedback rate $\beta_i$ is given by $\beta_i = 1/(1+kC_L^2)$, where k is expressed by a function of $\omega_i$, $R_d$ and $R_{ei}$. Also, $R_{ei}$ is approximately equal to series resistance $R_i$.

Thus, it is easily understood from a relationship of the feedback rate $\beta_i$ and load capacitance $C_L$ that the feedback rate of resonance frequency for a fundamental mode vibration and an overtone mode vibration becomes large, respectively, according to decrease of load capacitance $C_L$. Therefore, when CL has a small value, an oscillation of the overtone mode occurs very easily, instead of that of the fundamental mode. This is the reason why a maximum amplitude of the overtone mode vibration becomes smaller than that of the fundamental mode vibration, and the oscillation of the overtone mode satisfies an amplitude condition and a phase condition simultaneously which are the continuous condition of an oscillation in an oscillating circuit.

In addition, in order to suppress a second overtone mode vibration and to obtain a quartz crystal oscillator comprising a quartz crystal oscillating circuit, comprising a flexural mode, quartz crystal tuning fork resonator and having an output signal of a frequency of a fundamental mode vibration, the quartz crystal oscillating circuit in this embodiment is constructed so that it satisfies a relationship of $\alpha_1/\alpha_2 > \beta_2/\beta_1$ and $\alpha_1\beta_1 > 1$, where $\alpha_1$ and $\alpha_2$ are a amplification rate of the fundamental mode vibration and the second overtone mode vibration of an amplification circuit, and $\beta_1$ and $\beta_2$ are a feedback rate of the fundamental mode vibration and the second overtone mode vibration of a feedback circuit.

In other words, the quartz crystal oscillating circuit is constructed so that a ratio of the amplification rate $\alpha_1$ of the fundamental mode vibration and the amplification rate $\alpha_2$ of the second overtone mode vibration of the amplification circuit is larger than that of the feedback rate $\beta_2$ of the second overtone mode vibration and the feedback rate $\beta_1$ of the fundamental mode vibration of the feedback circuit, and a product of the amplification rate $\alpha_1$ and the feedback rate $\beta_1$ of the fundamental mode vibration is larger than 1. By constructing the oscillating circuit like this, it can be provided with reduced electric current consumption and the output signal of the frequency of the fundamental mode vibration.

Also, characteristics of the amplifier of the amplification circuit constructing the quartz crystal oscillating circuit of this embodiment can be expressed by negative resistance $-RL_i$. For example, when i=1, negative resistance $-RL_1$ is for a fundamental mode vibration and when i=2, negative resistance $-RL_2$ is for a second overtone mode vibration. In this embodiment, the quartz crystal oscillating circuit is constructed so that a ratio of an absolute value of negative resistance, $|-RL_1|$ of the fundamental mode vibration of the amplification circuit and series resistance $R_1$ of the fundamental mode vibration is larger than that of an absolute value of negative resistance, $|-RL_2|$ of the second overtone mode vibration of the amplification circuit and series resistance $R_2$ of the second overtone mode vibration. That is to say, the oscillating circuit is constructed so that it satisfies a relationship of $|-R_1|/R_1 > |-RL_2|/R_2$. By constructing the oscillating circuit like this, an oscillation of the second overtone mode can be suppressed, as a result of which an output signal of a frequency of the fundamental mode vibration can be provided because an oscillation of the fundamental mode generates easily in the oscillating circuit.

Figure 10:
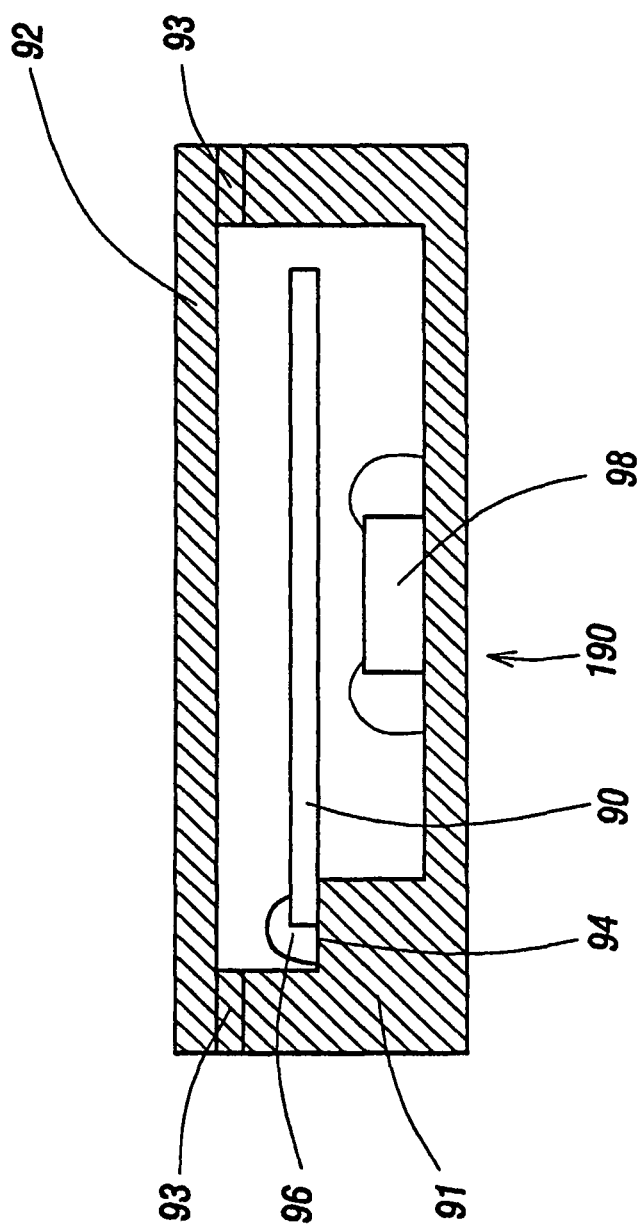
FIG. 10 shows a cross-sectional view of a quartz crystal oscillator embodying the present invention.

FIG. 10 shows a cross-sectional view of a quartz crystal oscillator embodying the present invention. The quartz crystal oscillator 190 comprises a quartz crystal oscillating circuit, a case 91 and a lid 92. In this embodiment, circuit elements constructing the oscillating circuit are housed in a quartz crystal unit comprising a flexural mode, quartz crystal tuning fork resonator 90, the case 91 and the lid 92. Also, the quartz crystal oscillating circuit of this embodiment comprises an amplifier 98 including a feedback resistor, the quartz crystal tuning fork resonator 90, capacitors (not shown here) and a drain resistor (not shown here), and a CMOS inverter is used as the amplifier 98.

In addition, in this embodiment, the resonator 90 is mounted at a mounting portion 94 of the case 91 by conductive adhesives 96 or solder. As described above, the amplifier 98 is housed in the quartz crystal unit and mounted at the case 91. Also, the case 91 and the lid 92 are connected through a connecting member 93. The resonator 90 of this embodiment is the same as one of the flexural mode, quartz crystal tuning fork resonators 10 and 45 described in detail in FIG. 1-FIG. 4. In this embodiment, though the resonator and the amplifier are housed in the same room, the present invention is not limited to this, for example, a room of the case is divided into two rooms by a divided portion, and the amplifier is housed in one of the two rooms and the flexural mode, quartz crystal tuning fork resonator is housed in other room. Namely, the resonator and the amplifier are housed in a separate room. Therefore, the quartz crystal oscillator of the present invention also includes that construction.

Likewise, in this embodiment, a piece of flexural mode, quartz crystal tuning fork resonator is housed in the unit, but the present invention also includes a quartz crystal unit having a plurality of individual flexural mode, quartz crystal tuning fork resonators, and at least two of the plurality of individual resonators are connected electrically in parallel. In detail, the at least two resonators may be an individual resonator or may be an individual resonator that is formed integrally at each tuning base through a connecting portion.

The above-described resonators are formed by at least one method of chemical, mechanical and physical etching methods. For example, the physical etching method is a method by ion etching, so called "plasma etching".

In addition, for the flexural mode quartz crystal tuning fork resonators of the embodiments of the present invention, the resonators are provided so that a capacitance ratio $r_1$ of a fundamental mode vibration gets smaller than a capacitance ratio $r_2$ of a second overtone mode vibration, in order to obtain a frequency change of the fundamental mode vibration larger than that of the second overtone mode vibration, versus the same change of a value of load capacitance $C_L$. Namely, a variable range of a frequency of the fundamental mode vibration gets wider than that of the second overtone mode vibration. Also, $C_L$ has a value less than 0.18 pF to decrease electric current consumption in a quartz crystal oscillating circuit.

Moreover, capacitance ratios $r_1$ and $r_2$ of a flexural mode, quartz crystal tuning fork resonator are given by $r_1=C_0/C_1$ and $r_2=C_0/C_2$, respectively, where $C_0$ is shunt capacitance in an electrical equivalent circuit of the resonator, and $C_1$ and $C_2$ are, respectively, motional capacitance of a fundamental mode vibration and a second overtone mode vibration in the electrical equivalent circuit of the resonator. In addition, the flexural mode, quartz crystal tuning fork resonator has a quality factor $Q_1$ for the fundamental mode vibration and a quality factor $Q_2$ for the second overtone mode vibration.

In detail, the tuning fork resonator of this embodiment is provided so that the influence on resonance frequency of the fundamental mode vibration by the shunt capacitance becomes smaller than that of the second overtone mode vibration by the shunt capacitance, namely, so that it satisfies a relationship of $r_1/2Q_1^2 < r_2/2Q_2^2$. As a result, the tuning fork resonator, capable of vibrating in the fundamental mode and having a high frequency stability can be provided because the influence on the resonance frequency of the fundamental mode vibration by the shunt capacitance becomes so extremely small as it can be ignored. Also, the present invention replaces $r_1/2Q_1^2$ with $S_1$ and $r_2/2Q_2^2$ with $S_2$, respectively, and here, $S_1$ and $S_2$ are called "stable factor of frequency" of the fundamental mode vibration and the second overtone mode vibration. Namely, $S_1$ and $S_2$ are given by $S_1=r_1/2Q_1^2$ and $S_2=r_2/2Q_2^2$, respectively.

In addition, when a power source is applied to the quartz crystal oscillating circuit, at least one oscillation which satisfies an amplitude condition and a phase condition of vibration starts in the circuit, and a spent time to get to about ninety percent of the steady amplitude of the vibration is called "rise time" here. Namely, the shorter the rise time becomes, the easier the oscillation becomes. When rise time $t_{r1}$ of the fundamental mode vibration and rise time $t_{r2}$ of the second overtone mode vibration in the circuit are taken, $t_{r1}$ and $t_{r2}$ are given by $t_{r1}=kQ_1/(\omega_1(-1+|-RL_1|/R_1))$ and $t_{r2}=kQ_2/(\omega_2(-1+|-RL_2|/R_2))$, respectively, where k is constant and $\omega_1$ and $\omega_2$ are an angular frequency for the fundamental mode vibration and the second overtone mode vibration, respectively.

From the above-described relation, it is possible to obtain the rise time $t_{r1}$ of the fundamental mode vibration less than the rise time $t_{r2}$ of the second overtone mode vibration. As an example, when resonance frequency of a flexural mode, quartz crystal tuning fork resonator is about 32.768 kHz for a fundamental mode vibration and the resonator has a value of $W_2/W=0.5$, $t_1/t=0.34$ and $l_1/l=0.48$, though there is a distribution in production, as an example, the resonator has a value of $Q_1=62,000$ and $Q_2=192,000$, respectively. In this embodiment, $Q_2$ has a value of about three times of $Q_1$. Accordingly, to obtain the $t_{r1}$ less than the $t_{r2}$, it is necessary to satisfy a relationship of $|-RL_1|/R_1 > 2|-RL_2|/R_2-1$ by using a relation of $\omega_2=6\omega_1$ approximately.

Also, according to this invention, the relationship is not limited to the quartz crystal oscillating circuit comprising the resonator in this embodiment, but this invention includes all quartz crystal oscillating circuits to satisfy the relationship. By constructing the oscillating circuit like this, a quartz crystal oscillator with the flexural mode, quartz crystal tuning fork resonator can be provided with a short rise time. In other words, an output signal of the oscillator has a frequency of a fundamental mode vibration of the resonator whose frequency is within a range of 32.764 kHz to 32.772 kHz, and is outputted through a buffer circuit. Namely, the second overtone mode vibration can be suppressed in the oscillating circuit. In this embodiment, the resonator has also a value of $r_1=320$ and $r_2=10,600$ as an example.

In addition, the contour mode quartz crystal resonators described in the embodiments of the present invention, each of which is a flexural mode, quartz crystal tuning fork resonator, a width-extensional mode quartz crystal resonator, a length-extensional mode quartz crystal resonator and a Lame mode quartz crystal resonator, can be applied to an electronic apparatus comprising a display portion and a quartz crystal oscillator at least such as cellar phone, telephone, TV set, camera, video set, video camera, pagers, personal computer, printer, CD player, MD player, electronic musical instrument, car navigator, car electronics, timepiece, IC card and so forth.

In detail, the contour mode quartz crystal resonators each of which constructs a quartz crystal oscillator comprising: a quartz crystal oscillating circuit comprising; an amplification circuit and a feedback circuit as described above, are used as a clock signal of the electronic apparatus. In more detail, an output signal of the quartz crystal oscillating circuit comprising the quartz crystal tuning fork resonator capable of vibrating in a flexural mode has a frequency of 32.764 kHz to 32.772 kHz and is outputted through a buffer circuit, and the output signal is a clock signal which is used to display time at the display portion of the electronic apparatus.

Likewise, an output signal of the quartz crystal oscillating circuit comprising a width-extensional mode quartz crystal resonator or a length-extensional mode quartz crystal resonator or a Lame mode quartz crystal resonator is outputted through a buffer circuit, and the output signal is a clock signal which is used except time display of the electronic apparatus.

In the present embodiments, the metal films for frequency adjustment are formed on the tuning fork tines. As an example of the present invention, silver or gold is used as a material of the metal films and for example, the metal films are formed on at least two faces of obverse and reverse faces of the tuning fork tines. Preferably, the at least two faces are of the same faces.

As described above, it will be easily understood that the quartz crystal resonators, the quartz crystal units and the quartz crystal oscillators of the present invention may have the outstanding effects. For example, the quartz crystal oscillator comprising: the quartz crystal oscillating circuit comprising; the amplification circuit and the feedback circuit having the flexural mode, quartz crystal tuning fork resonator, capable, of vibrating in a fundamental mode and having the novel shapes, the novel electrode construction and good electrical characteristics, according to the present invention may have the outstanding effects. In addition to this, while the present invention has been shown and described with reference to preferred embodiments thereof, it will be understood by those skilled in the art that the changes in shape and electrode construction can be made therein without departing from the spirit and scope of the present invention.

What is claimed is:

1. A method for manufacturing a quartz crystal unit, comprising the steps of:
    providing a quartz crystal wafer having opposite surfaces;
    disposing at least one metal film on at least one opposite surfaces of the quartz crystal wafer;
    disposing a resist on the at least one metal film;
    forming a pattern of a tuning fork shape on the at least one of the opposite surfaces of the quartz crystal wafer;
    etching the quartz crystal wafer after the forming step of the pattern to form a quartz crystal tuning fork shape having a quartz crystal tuning fork base, and first and second quartz crystal tuning fork tines connected to the quartz crystal tuning fork base, each of the first and second quartz crystal tuning fork tines having opposite main surfaces and opposite side surfaces;
    forming an electrode on at least one of the opposite side surfaces of each of the first and second quartz crystal tuning fork tines so that the electrode formed on the at least one of the opposite side surfaces of the first quartz crystal tuning fork tine has an electrical polarity opposite to an electrical polarity of the electrode formed on the at least one of the opposite side surfaces of the second quartz crystal tuning fork tine to form a quartz crystal tuning fork resonator that vibrates in a flexural mode of an inverse phase;
    removing the resist disposed on the at least one metal film before the forming step of the electrode;
    providing a case having a through-hole and a mounting portion;
    mounting the quartz crystal tuning fork resonator on the mounting portion of the case by a conductive adhesive or a solder;
    disposing a metal or a glass into the through-hole of the case to close the through-hole thereof in a vacuum; and
    adjusting an oscillation frequency of the quartz crystal tuning fork resonator after the mounting step.

2. A method according to claim 1; wherein the quartz crystal tuning fork resonator has an overall length, and a fundamental mode of vibration and a second overtone mode of vibration; and further comprising the steps of forming at least one groove having a length in at least one of the opposite main surfaces of each of the first and second quartz crystal tuning fork tines; and determining the overall length of the quartz crystal tuning fork resonator and the length of the at least one groove formed in the at least one of the opposite main surfaces of each of the first and second quartz crystal tuning fork tines so that a series resistance $R_1$ of the fundamental mode of vibration of the quartz crystal tuning fork resonator is less than a series resistance $R_2$ of the second overtone mode of vibration thereof.

3. A method according to claim 2; wherein the opposite surfaces of the quartz crystal wafer have a first surface and a second surface; wherein the disposing step of the at least one metal film comprises disposing at least one first metal film on each of the first and second surfaces of the quartz crystal wafer; wherein the disposing step of the resist comprises disposing a first resist on the at least one first metal film; wherein the forming step of the pattern comprises forming a pattern of a tuning fork shape on each of the first and second surfaces of the quartz crystal wafer; wherein the opposite main surfaces have a first main surface and a second main surface; wherein the opposite side surfaces have a first side surface and a second side surface; wherein the forming step of the at least one groove comprises forming a groove in each of the first and second main surfaces of each of the first and second quartz crystal tuning fork tines; wherein the quartz crystal tuning fork resonator has an oscillation frequency of the fundamental mode of vibration; and further comprising the steps of disposing at least one second metal film on each of the first and second main surfaces and the first and second side surfaces of each of the first and second quartz crystal tuning fork tines, and a side surface of the groove formed in each of the first and second main surfaces of each of the first and second quartz crystal tuning fork tines; disposing a second resist on the at least one second metal film; forming a first electrode on the side surface of the groove formed in each of the first and second main surfaces of each of the first and second quartz crystal tuning fork tines and a second electrode on each of the first and second side surfaces of each of the first and second quartz crystal tuning fork tines so that the first electrode formed on the side surface of the groove formed in each of the first and second main surfaces of the first quartz crystal tuning fork tine is connected to the second electrode formed on each of the first and second side surfaces of the second quartz crystal tuning fork tine and the first electrode formed on the side surface of the groove formed in each of the first and second main surfaces of the second quartz crystal tuning fork tine is connected to the second electrode formed on each of the first and second side surfaces of the first quartz crystal tuning fork tine, and the oscillation frequency of the fundamental mode of vibration of the quartz crystal tuning fork resonator comprises a first preselected oscillation frequency; removing the second resist disposed on the at least one second metal film; and removing the first resist disposed on the at least one first metal film before the forming step of the first and second electrodes.

4. A method according to claim 3; wherein the first preselected oscillation frequency is higher than 32.768 kHz; and further comprising the steps of forming a metal film on at least one of the opposite main surfaces of the first and second quartz crystal tuning fork tines so that the oscillation frequency of the fundamental mode of vibration of the quartz crystal tuning fork resonator comprises a second preselected oscillation frequency; trimming the metal film formed on the at least one of the opposite main surfaces of the first and second quartz crystal tuning fork tines so that the oscillation frequency of the fundamental mode of vibration of the quartz crystal tuning fork resonator comprises a third preselected oscillation frequency; and adjusting the oscillation frequency of the fundamental mode of vibration of the quartz crystal tuning fork resonator so that the oscillation frequency thereof comprises a fourth preselected oscillation frequency.

5. A method according to claim 4; wherein the forming step of the metal film is performed after the forming step of the at least one groove and before the mounting step so that the second preselected oscillation frequency is in the range of 29.4 kHz to 32.75 kHz; wherein the trimming step of the metal film is performed before the mounting step so that the third preselected oscillation frequency is in the range of 32.2 kHz to 33.08 kHz; and wherein the adjusting step of the oscillation frequency is performed after the mounting step so that the fourth preselected oscillation frequency is in the range of 32.764 kHz to 32.772 kHz.

6. A method according to claim 5; wherein the case is a ceramics case having an interior space and a mounting portion in the interior space, and a through-hole; and further comprising the sequential steps of mounting the quartz crystal tuning fork resonator on the mounting portion in the interior space of the ceramics case by a conductive adhesive after the removing step of the second resist; adjusting the oscillation frequency of the fundamental mode of vibration of the quartz crystal tuning fork resonator so that the oscillation frequency thereof is in the range of 32.764 kHz to 32.772 kHz; connecting a lid to the ceramics case to cover an open end of the ceramics case; and disposing a metal or a glass into the through-hole of the ceramics case to close the through-hole thereof in a vacuum.

7. A method according to claim 2; wherein the opposite main surfaces have a first main surface and a second main surface; wherein the opposite side surfaces have a first side surface and a second side surface; wherein the case is a ceramics case having an interior space and a mounting portion in the interior space, and a through-hole; wherein the quartz crystal tuning fork resonator has an oscillation frequency of the fundamental mode of vibration; and further comprising the sequential steps of forming a groove in each of the first and second main surfaces of each of the first and second quartz crystal tuning fork tines; forming a first electrode on a side surface of the groove formed in each of the first and second main surfaces of each of the first and second quartz crystal tuning fork tines and a second electrode on each of the first and second side surfaces of each of the first and second quartz crystal tuning fork tines so that the oscillation frequency of the fundamental mode of vibration of the quartz crystal tuning fork resonator is higher than 32.768 kHz; forming a metal film on each of at least two of the opposite main surfaces of the first and second quartz crystal tuning fork tines so that the oscillation frequency of the fundamental mode of vibration of the quartz crystal tuning fork resonator comprises a first preselected oscillation frequency; trimming the metal film formed on each of the at least two of the opposite main surfaces of the first and second quartz crystal tuning fork tines so that the oscillation frequency of the fundamental mode of vibration of the quartz crystal tuning fork resonator comprises a second preselected oscillation frequency; mounting the quartz crystal tuning fork resonator on the mounting portion in the interior space of the ceramics case by a conductive adhesive or a solder; adjusting the oscillation frequency of the fundamental mode of vibration of the quartz crystal tuning fork resonator so that the oscillation frequency thereof comprises a third preselected oscillation frequency; connecting a lid to the ceramics case to cover an open end of the ceramics case; and disposing a metal or a glass into the through-hole of the ceramics case to close the through-hole thereof in a vacuum.

8. A method according to claim 7; wherein the first preselected oscillation frequency is in the range of 29.4 kHz to 32.75 kHz; wherein the second preselected oscillation frequency is in the range of 32.2 kHz to 33.08 kHz; and the third preselected oscillation frequency is in the range of 32.764 kHz to 32.772 kHz.

9. A method according to claim 2; wherein the opposite main surfaces have a first main surface and a second main surface; wherein the opposite side surfaces have a first side surface and a second side surface; wherein the case is a ceramics case having an interior space and a mounting portion in the interior space, and a through-hole; wherein the quartz crystal tuning fork resonator has an oscillation frequency of the fundamental mode of vibration; and further comprising the sequential steps of forming a groove in each of the first and second main surfaces of each of the first and second quartz crystal tuning fork tines; forming a first electrode on a side surface of the groove formed in each of the first and second main surfaces of each of the first and second quartz crystal tuning fork tines and a second electrode on each of the first and second side surfaces of each of the first and second quartz crystal tuning fork tines so that the oscillation frequency of the fundamental mode of vibration of the quartz crystal tuning fork resonator is higher than 32.768 kHz; forming a metal film on each of at least two of the opposite main surfaces of the first and second quartz crystal tuning fork tines so that the oscillation frequency of the fundamental mode of vibration of the quartz crystal tuning fork resonator is in the range of 29.4 kHz to 32.75 kHz; trimming the metal film formed on each of the at least two of the opposite main surfaces of the first and second quartz crystal tuning fork tines so that the oscillation frequency of the fundamental mode of vibration of the quartz crystal tuning fork resonator is in the range of 32.2 kHz to 33.08 kHz; mounting the quartz crystal tuning fork resonator on the mounting portion in the interior space of the ceramics case by a conductive adhesive or a solder; connecting a lid to the ceramics case to cover an open end of the ceramics case; disposing a metal or a glass into the through-hole of the ceramics case to close the through-hole thereof in a vacuum; and adjusting the oscillation frequency of the fundamental mode of vibration of the quartz crystal tuning fork resonator so that the oscillation frequency thereof is in the range of 32.766 kHz to 32.77 kHz.

10. A method according to claim 2; wherein the opposite main surfaces have a first main surface and a second main surface; wherein the opposite side surfaces have a first side surface and a second side surface; wherein the case is a ceramics case having an interior space and a mounting portion in the interior space, and a through-hole; wherein the quartz crystal tuning fork resonator has an oscillation frequency of the fundamental mode of vibration; and further comprising the sequential steps of forming a groove in each of the first and second main surfaces of each of the first and second quartz crystal tuning fork tines; forming a first electrode on a side surface of the groove formed in each of the first and second main surfaces of each of the first and second quartz crystal tuning fork tines and a second electrode on each of the first and second side surfaces of each of the first and second quartz crystal tuning fork tines so that the oscillation frequency of the fundamental mode of vibration of the quartz crystal tuning fork resonator is higher than 32.768 kHz; forming a metal film on each of at least two of the opposite main surfaces of the first and second quartz crystal tuning fork tines so that the oscillation frequency of the fundamental mode of vibration of the quartz crystal tuning fork resonator is in the range of 29.4 kHz to 32.75 kHz; trimming the metal film formed on each of the at least two of the opposite main surfaces of the first and second quartz crystal tuning fork tines so that the oscillation frequency of the fundamental mode of vibration of the quartz crystal tuning fork resonator is in the range of 32.2 kHz to 33.08 kHz; mounting the quartz crystal tuning fork resonator on the mounting portion in the interior space of the ceramics case by a conductive adhesive or a solder; connecting a lid to the ceramics case to cover an open end of the ceramics case; adjusting in a vacuum the oscillation frequency of the fundamental mode of vibration of the quartz crystal tuning fork resonator so that the oscillation frequency thereof is in the range of 32.764 kHz to 32.772 kHz; and disposing a metal or a glass into the through-hole of the ceramics case to close the through-hole thereof in a vacuum.

11. A method according to claim 1; wherein the quartz crystal tuning fork resonator has a stable factor $S_1$ of a fundamental mode of vibration and a stable factor $S_2$ of a second overtone mode of vibration, the stable factor $S_1$ being defined by $S_1=r_1/2Q_1^2$ and the stable factor $S_2$ being defined by $S_2=r_2/2Q_2^2$, where $Q_1$ and $Q_2$ represent a quality factor of the fundamental mode of vibration and the second overtone mode of vibration, respectively, of the quartz crystal tuning fork resonator and $r_1$ and $r_2$ represent a capacitance ratio of the fundamental mode of vibration and the second overtone mode of vibration, respectively, of the quartz crystal tuning fork resonator; wherein the opposite main surfaces have a first main surface and a second main surface; and further comprising the steps of forming at least one groove in each of the first and second main surfaces of each of the first and second quartz crystal tuning fork tines; disposing an electrode on a side surface of the at least one groove formed in each of the first and second main surfaces of each of the first and second quartz crystal tuning fork tines, each of the quartz crystal tuning fork shape, the at least one groove formed in each of the first and second main surfaces of each of the first and second quartz crystal tuning fork tines and the electrode disposed on the side surface of the at least one groove formed in each of the first and second main surfaces of each of the first and second quartz crystal tuning fork tines having a dimension; and determining the dimension of each of the quartz crystal tuning fork shape, the at least one groove formed in each of the first and second main surfaces of each of the first and second quartz crystal tuning fork tines and the electrode disposed on the side surface of the at least one groove formed in each of the first and second main surfaces of each of the first and second quartz crystal tuning fork tines so that the stable factor $S_1$ of the fundamental mode of vibration of the quartz crystal tuning fork resonator is less than the stable factor $S_2$ of the second overtone mode of vibration thereof.

12. A method according to claim 1; wherein the quartz crystal tuning fork resonator has an oscillation frequency of a fundamental mode of vibration; wherein the case is a ceramics case having an interior space and a mounting portion in the interior space, and a through-hole; wherein the opposite main surfaces have a first main surface and a second main surface; wherein the opposite side surfaces have a first side surface and a second side surface; wherein the opposite surfaces of the quartz crystal wafer have a first surface and a second surface; and further comprising the sequential steps of disposing at least one first metal film on each of the first and second surfaces of the quartz crystal wafer; disposing a first resist on the at least one first metal film; removing the first resist and the at least one first metal film to form a pattern of a tuning fork shape on each of the first and second surfaces of the quartz crystal wafer; forming the quartz crystal tuning fork shape having the quartz crystal tuning fork base, and the first and second quartz crystal tuning fork tines; forming at least one groove in each of the first and second main surfaces of each of the first and second quartz crystal tuning fork tines; disposing at least one second metal film on each of the first and second main surfaces and the first and second side surfaces of each of the first and second quartz crystal tuning fork tines, and a side surface of the at least one groove formed in each of the first and second main surfaces of each of the first and second quartz crystal tuning fork tines; disposing a second resist on the at least one second metal film; forming a first electrode on the side surface of the at least one groove formed in each of the first and second main surfaces of each of the first and second quartz crystal tuning fork tines and a second electrode on each of the first and second side surfaces of each of the first and second quartz crystal tuning fork tines so that the first electrode formed on the side surface of the at least one groove formed in each of the first and second main surfaces of the first quartz crystal tuning fork tine is connected to the second electrode formed on each of the first and second side surfaces of the second quartz crystal tuning fork tine and the first electrode formed on the side surface of the at least one groove formed in each of the first and second main surfaces of the second quartz crystal tuning fork tine is connected to the second electrode formed on each of the first and second side surfaces of the first quartz crystal tuning fork tine, and the oscillation frequency of the fundamental mode of vibration of the quartz crystal tuning fork resonator comprises a first preselected oscillation frequency; forming a metal film on at least one of the opposite main surfaces of the first and second quartz crystal tuning fork tines so that the oscillation frequency of the fundamental mode of vibration of the quartz crystal tuning fork resonator comprises a second preselected oscillation frequency; trimming the metal film formed on the at least one of the opposite main surfaces of the first and second quartz crystal tuning fork tines in the quartz crystal wafer so that the oscillation frequency of the fundamental mode of vibration of the quartz crystal tuning fork resonator comprises a third preselected oscillation frequency; mounting the quartz crystal tuning fork resonator on the mounting portion in the interior space of the ceramics case by a conductive adhesive or a solder; connecting a lid to the ceramics case to cover an open end of the ceramics case; and disposing a metal or a glass into the through-hole of the ceramics case to close the through-hole thereof in a vacuum; wherein the first resist is removed before the at least one second metal film is disposed; wherein the quartz crystal tuning fork resonator is electrically connected to an amplifier, a plurality of capacitors and at least one resistor to form a quartz crystal oscillating circuit; wherein the quartz crystal oscillating circuit comprising the quartz crystal tuning fork resonator is arranged in an electronic apparatus; and wherein an output signal of the quartz crystal oscillating circuit comprising the quartz crystal tuning fork resonator is a clock signal for use in operation of the electronic apparatus.

13. A method according to claim 12; wherein the first preselected oscillation frequency is higher than 32.768 kHz; wherein the second preselected oscillation frequency is in the range of 29.4 kHz to 32.75 kHz; and wherein the third preselected oscillation frequency is in the range of 32.2 kHz to 33.08 kHz.

14. A method according to claim 1; wherein the opposite main surfaces have a first main surface and a second main surface; wherein the opposite side surfaces have a first side surface and a second side surface, the first side surface of the first quartz crystal tuning fork resonator confronting the first side surface of the second quartz crystal tuning fork resonator; and further comprising the step of forming a groove having a first surface opposite the first side surface and a second surface opposite the second side surface in each of the first and second main surfaces of each of the first and second quartz crystal tuning fork tines; wherein a distance in the width direction of at least one of the grooves measured from a first outer edge of the first surface of the at least one groove to a first outer edge of the first side surface of the corresponding one of the first and second quartz crystal tuning fork tines is defined by $W_1$ and a distance in the width direction of the at least one groove measured from a second outer edge of the second surface of the at least one groove to a second outer edge of the second side surface of the corresponding one of the first and second quartz crystal tuning fork tines is defined by $W_3$; and wherein $W_1$ is greater than $W_3$.

15. A method according to claim 1; wherein the quartz crystal tuning fork resonator has a merit value $M_1$ of a fundamental mode of vibration and a merit value $M_2$ of a second overtone mode of vibration, the merit value $M_1$ being defined by the ratio $(Q_1/r_1)$ and the merit value $M_2$ being defined by the ratio $(Q_2/r_2)$, where $Q_1$ and $Q_2$ represent a quality factor of the fundamental mode of vibration and the second overtone mode of vibration, respectively, of the quartz crystal tuning fork resonator and $r_1$ and $r_2$ represent a capacitance ratio of the fundamental mode of vibration and the second overtone mode of vibration, respectively, of the quartz crystal tuning fork resonator; wherein the opposite main surfaces have a first main surface and a second main surface; and further comprising the steps of forming at least one groove in each of the first and second main surfaces of each of the first and second quartz crystal tuning fork tines; forming a first electrode on a side surface of the at least one groove formed in each of the first and second main surfaces of each of the first and second quartz crystal tuning fork tines, each of the quartz crystal tuning fork shape, the at least one groove formed in each of the first and second main surfaces of each of the first and second quartz crystal tuning fork tines and the first electrode formed on the side surface of the at least one groove formed in each of the first and second main surfaces of each of the first and second quartz crystal tuning fork tines having a dimension; and determining the dimension of each of the quartz crystal tuning fork shape; the at least one groove formed in each of the first and second main surfaces of each of the first and second quartz crystal tuning fork tines and the first electrode formed on the side surface of the at least one groove formed in each of the first and second main surfaces of each of the first and second quartz crystal tuning fork tines so that the capacitance ratio $r_1$ is less than the capacitance ratio $r_2$ and the quality factor $Q_1$ is less than the quality factor $Q_2$, and the merit value $M_1$ is greater than the merit value $M_2$.

16. A method for manufacturing a quartz crystal oscillator, comprising the steps of:
manufacturing a quartz crystal unit according to claim 1;
providing an amplifier, at least one resistor and a plurality of capacitors;
electrically connecting the quartz crystal tuning fork resonator of the quartz crystal unit to the amplifier, the at least one resistor and the capacitors to form a quartz crystal oscillating circuit; and
arranging the quartz crystal oscillating circuit in an electronic apparatus having a display portion;
wherein an output signal of the quartz crystal oscillating circuit is a clock signal for use in operation of the electronic apparatus to display time information at the display portion, the clock signal having an oscillation frequency of a fundamental mode of vibration of the quartz crystal tuning fork resonator and the oscillation frequency of the fundamental mode of vibration thereof being in the range of 32.764 kHz to 32.772 kHz.

17. A method according to claim 16; wherein the quartz crystal tuning fork resonator has an overall length and a second overtone mode of vibration; wherein the opposite main surfaces have a first main surface and a second main surface; and further comprising the steps of forming at least one groove having a length in each of the first and second main surfaces of each of the first and second quartz crystal tuning fork tines; and determining the overall length of the quartz crystal tuning fork resonator and the length of the at least one groove formed in each of the first and second main surfaces of each of the first and second quartz crystal tuning fork tines so that a series resistance $R_1$ of the fundamental mode of vibration of the quartz crystal tuning fork resonator is less than a series resistance $R_2$ of the second overtone mode of vibration thereof.

18. A method according to claim 16; wherein the opposite main surfaces have a first main surface and a second main surface; wherein the opposite side surfaces have a first side surface and a second side surface, the first side surface of the first quartz crystal tuning fork resonator confronting the first side surface of the second quartz crystal tuning fork resonator; and further comprising the step of forming a groove having a first surface opposite the first side surface and a second surface opposite the second side surface in each of the first and second main surfaces of each of the first and second quartz crystal tuning fork tines so that a length of the groove formed in each of the first and second main surfaces of each of the first and second quartz crystal tuning fork tines is within a range of 40% to 80% of a length of each of the first and second quartz crystal tuning fork tines; wherein a distance in the width direction of at least one of the grooves measured from a first outer edge of the first surface of the at least one groove to a first outer edge of the first side surface of the corresponding one of the first and second quartz crystal tuning fork tines is defined by $W_1$ and a distance in the width direction of the at least one groove measured from a second outer edge of the second surface of the at least one groove to a second outer edge of the second side surface of the corresponding one of the first and second quartz crystal tuning fork tines is defined by $W_3$; and wherein $W_1$ is less than $W_3$.

19. A method according to claim 16; wherein the opposite main surfaces have a first main surface and a second main surface; wherein the opposite side surfaces have a first side surface and a second side surface; wherein the opposite surfaces of the quartz crystal wafer have a first surface and a second surface; and further comprising the steps of disposing at least one first metal film on each of the first and second surfaces of the quartz crystal wafer; disposing a first resist on the at least one first metal film; forming a pattern of a tuning fork shape on each of the first and second surfaces of the quartz crystal wafer; forming the quartz crystal tuning fork base having a first base portion including a first width $W_5$ and a second base portion including a second width $W_6$ greater than or equal to the first width $W_5$, and the first and second quartz crystal tuning fork tines so that two cut portions are formed between the first and second base portions of the quartz crystal tuning fork base and a spaced-apart distance between the first and second quartz crystal tuning fork tines is within a range of 0.05 mm to 0.35 mm, each of the first and second quartz crystal tuning fork tines being connected to the first base portion of the quartz crystal tuning fork base; forming at least one groove in each of the first and second main surfaces of each of the first and second quartz crystal tuning fork tines so that a width of the at least one groove formed in each of the first and second main surfaces of each of the first and second quartz crystal tuning fork tines is within a range of 0.02 mm to 0.068 mm; disposing at least one second metal film on each of the first and second main surfaces and the first and second side surfaces of each of the first and second quartz crystal tuning fork tines, and a side surface of the at least one groove formed in each of the first and second main surfaces of each of the first and second quartz crystal tuning fork tines; disposing a second resist on the at least one second metal film; forming a first electrode on the side surface of the at least one groove formed in each of the first and second main surfaces of each of the first and second quartz crystal tuning fork tines and a second electrode on each of the first and second side surfaces of each of the first and second quartz crystal tuning fork tines so that the first electrode formed on the side surface of the at least one groove formed in each of the first and second main surfaces of the first quartz crystal tuning fork tine is connected to the second electrode formed on each of the first and second side surfaces of the second quartz crystal tuning fork tine and the first electrode formed on the side surface of the at least one groove formed in each of the first and second main surfaces of the second quartz crystal tuning fork tine is connected to the second electrode formed on each of the first and second side surfaces of the first quartz crystal tuning fork tine, and the oscillation frequency of the fundamental mode of vibration of the quartz crystal tuning fork resonator comprises a first preselected oscillation frequency; removing the second resist disposed on the at least one second metal film; and removing the first resist disposed on the at least one first metal film before the forming step of the first and second electrodes.

20. A method according to claim 19; wherein the first preselected oscillation frequency is higher than 32.768 kHz; wherein the quartz crystal tuning fork resonator has a second overtone mode of vibration, and a merit value $M_1$ of the fundamental mode of vibration and a merit value $M_2$ of the second overtone mode of vibration, the merit value $M_1$ being defined by the ratio $(Q_1/r_1)$ and the merit value $M_2$ being defined by the ratio $(Q_2/r_2)$, where $Q_1$, and $Q_2$ represent a quality factor of the fundamental mode of vibration and the second overtone mode of vibration, respectively, of the quartz crystal tuning fork resonator and $r_1$ and $r_2$ represent a capacitance ratio of the fundamental mode of vibration and the second overtone mode of vibration, respectively, of the quartz crystal tuning fork resonator, each of the quartz crystal tuning fork shape, the at least one groove formed in each of the first and second main surfaces of each of the first and second quartz crystal tuning fork tines and the first electrode formed on the side surface of the at least one groove formed in each of the first and second main surfaces of each of the first and second quartz crystal tuning fork tines having a dimension; and further comprising the step of determining the dimension of each of the quartz crystal tuning fork shape; the at least one groove formed in each of the first and second main surfaces of each of the first and second quartz crystal tuning fork tines and the first electrode formed on the side surface of the at least one groove formed in each of the first and second main surfaces of each of the first and second quartz crystal tuning fork tines so that the merit value $M_1$ is greater than the merit value $M_2$.

21. A method according to claim 20; wherein the determining step comprises determining the dimension of each of the quartz crystal tuning fork shape; the at least one groove formed in each of the first and second main surfaces of each of the first and second quartz crystal tuning fork tines and the first electrode formed on the side surface of the at least one groove formed in each of the first and second main surfaces of each of the first and second quartz crystal tuning fork tines so that the capacitance ratio $r_1$ is less than the capacitance ratio $r_2$ and the quality factor $Q_1$ is less than the quality factor $Q_2$; and wherein the merit value $M_1$ is greater than 65 and the merit value $M_2$ is less than 30.

22. A method according to claim 19; wherein the first preselected oscillation frequency is higher than 32.768 kHz; and further comprising the steps of forming a metal film on at least one of the opposite main surfaces of the first and second quartz crystal tuning fork tines so that the oscillation frequency of the fundamental mode of vibration of the quartz crystal tuning fork resonator comprises a second preselected oscillation frequency; trimming the metal film formed on the at least one of the opposite main surfaces of the first and second quartz crystal tuning fork tines so that the oscillation frequency of the fundamental mode of vibration of the quartz crystal tuning fork resonator comprises a third preselected oscillation frequency; and adjusting the oscillation frequency of the fundamental mode of vibration of the quartz crystal tuning fork resonator so that the oscillation frequency thereof comprises a fourth preselected oscillation frequency.

23. A method according to claim 22; wherein the forming step of the metal film is performed after the forming step of the at least one groove and before the mounting step so that the second preselected oscillation frequency is in the range of 29.4 kHz to 32.75 kHz; wherein the trimming step of the metal film is performed before the mounting step so that the third preselected oscillation frequency is in the range of 32.2 kHz to 33.08 kHz; and wherein the adjusting step is performed after the mounting step so that the fourth preselected oscillation frequency is in the range of 32.764 kHz to 32.772 kHz.

24. A method according to claim 19; wherein the first preselected oscillation frequency is higher than 32.768 kHz; and further comprising the step of forming a metal film on each of at least two of the opposite main surfaces of the first and second quartz crystal tuning fork tines after the forming step of the at least one groove and before the mounting step so that the oscillation frequency of the fundamental mode of vibration of the quartz crystal tuning fork resonator comprises a second preselected oscillation frequency; wherein the case is a ceramics case having an interior space and a mounting portion in the interior space, and a through-hole; and further comprising the sequential steps of mounting the quartz crystal tuning fork resonator on the mounting portion in the interior space of the ceramics case by a conductive adhesive or a solder after the removing step of the second resist; adjusting the oscillation frequency of the fundamental mode of vibration of the quartz crystal tuning fork resonator so that the oscillation frequency thereof comprises a third preselected oscillation frequency; connecting a lid to the ceramics case to cover an open end of the ceramics case; disposing a metal or a glass into the through-hole of the ceramics case to close the through-hole thereof in a vacuum; and electrically connecting the quartz crystal tuning fork resonator to the amplifier, the at least one resistor and the capacitors.

25. A method according to claim 24; wherein the second preselected oscillation frequency is in the range of 29.4 kHz to 32.75 kHz; wherein the third preselected oscillation frequency is in the range of 32.764 kHz to 32.772 kHz; and further comprising the step of trimming the metal film formed on each of the at least two of the opposite main surfaces of the first and second quartz crystal tuning fork tines in the quartz crystal wafer so that the oscillation frequency of the fundamental mode of vibration of the quartz crystal tuning fork resonator is in the range of 32.2 kHz to 33.08 kHz.

26. A method according to claim 24; further comprising the step of adjusting the oscillation frequency of the fundamental mode of vibration of the quartz crystal tuning fork resonator after the disposing step of the metal or the glass and before the electrically connecting step so that the oscillation frequency thereof is in the range of 32.766 kHz to 32.77 kHz.

27. A method according to claim 19; wherein the first preselected oscillation frequency is higher than 32.768 kHz; and further comprising the steps of forming a metal film on each of at least two of the opposite main surfaces of the first and second quartz crystal tuning fork tines after the forming step of the at least one groove and before the mounting step so that the oscillation frequency of the fundamental mode of vibration of the quartz crystal tuning fork resonator is in the range of 29.4 kHz to 32.75 kHz; and trimming the metal film formed on each of the at least two of the opposite main surfaces of the first and second quartz crystal tuning fork tines in the quartz crystal wafer so that the oscillation frequency of the fundamental mode of vibration of the quartz crystal tuning fork resonator is in the range of 32.2 kHz to 33.08 kHz; wherein the case is a ceramics case having an interior space and a mounting portion in the interior space, and a through-hole; and further comprising the sequential steps of mounting the quartz crystal tuning fork resonator on the mounting portion in the interior space of the ceramics case by a conductive adhesive or a solder after the removing step of the second resist; connecting a glass lid to the ceramics case to cover an open end of the ceramics case; disposing a metal or a glass into the through-hole of the ceramics case to close the through-hole thereof in a vacuum; adjusting the oscillation frequency of the fundamental mode of vibration of the quartz crystal tuning fork resonator so that the oscillation frequency thereof is in the range of 32.766 kHz to 32.77 kHz; and electrically connecting the quartz crystal tuning fork resonator to the amplifier, the at least one resistor and the capacitors.

28. A method according to claim 27; further comprising the step of adjusting the oscillation frequency of the fundamental mode of vibration of the quartz crystal tuning fork resonator after the mounting step and before the connecting step of the glass lid and the ceramics case.

29. A method according to claim 19; wherein the first preselected oscillation frequency is higher than 32.768 kHz; and further comprising the steps of forming a metal film on each of at least two of the opposite main surfaces of the first and second quartz crystal tuning fork tines after the forming step of the at least one groove and before the mounting step; and trimming the metal film formed on each of the at least two of the opposite main surfaces of the first and second quartz crystal tuning fork tines; wherein the case is a ceramics case having an interior space and a mounting portion in the interior space, and a through-hole; and further comprising the sequential steps of mounting the quartz crystal tuning fork resonator on the mounting portion in the interior space of the ceramics case by a conductive adhesive or a solder after the removing step of the second resist; connecting a glass lid to the ceramics case to cover an open end of the ceramics case; adjusting in a vacuum the oscillation frequency of the fundamental mode of vibration of the quartz crystal tuning fork resonator so that the oscillation frequency thereof is in the range of 32.764 kHz to 32.772 kHz; disposing a metal or a glass into the through-hole of the ceramics case to close the through-hole thereof in a vacuum; and electrically connecting the quartz crystal tuning fork resonator to the amplifier, the at least one resistor and the capacitors.

30. A method according to claim 16; wherein the opposite main surfaces have a first main surface and a second main surface; wherein the opposite side surfaces have a first side surface and a second side surface; wherein the opposite surfaces of the quartz crystal wafer have a first surface and a second surface; and further comprising the sequential steps of disposing at least one first metal film on each of the first and second surfaces of the quartz crystal wafer; disposing a first resist on the at least one first metal film; forming a pattern of a tuning fork shape on each of the first and second surfaces of the quartz crystal wafer; forming the quartz crystal tuning fork base having a first base portion including a first width $W_5$ and a second base portion including a second width $W_6$ greater than or equal to the first width $W_5$, and the first and second quartz crystal tuning fork tines so that two cut portions are formed between the first and second base portions of the quartz crystal tuning fork base and a spaced-apart distance between the first and second quartz crystal tuning fork tines is within a range of 0.05 mm to 0.35 mm, each of the first and second quartz crystal tuning fork tines being connected to the first base portion of the quartz crystal tuning fork base and each of the first and second main surfaces of each of the first and second quartz crystal tuning fork tines having a central linear portion; forming at least one groove in the central linear portion of each of the first and second main surfaces of each of the first and second quartz crystal tuning fork tines so that a width of the at least one groove formed in the central linear portion of each of the first and second main surfaces of each of the first and second quartz crystal tuning fork tines is within a range of 0.02 mm to 0.068 mm and less than the spaced-apart distance within the range of 0.05 mm to 0.35 mm, and a length of the at least one groove formed in the central linear portion of each of the first and second main surfaces of each of the first and second quartz crystal tuning fork tines is within a range of 40% to 80% of a length of each of the first and second quartz crystal tuning fork tines; disposing at least one second metal film on each of the first and second main surfaces and the first and second side surfaces of each of the first and second quartz crystal tuning fork tines, and a side surface of the at least one groove formed in the central linear portion of each of the first and second main surfaces of each of the first and second quartz crystal tuning fork tines; disposing a second resist on the at least one second metal film; forming a first electrode on the side surface of the at least one groove formed in the central linear portion of each of the first and second main surfaces of each of the first and second quartz crystal tuning fork tines and a second electrode on each of the first and second side surfaces of each of the first and second quartz crystal tuning fork tines so that the first electrode formed on the side surface of the at least one groove formed in the central linear portion of each of the first and second main surfaces of the first quartz crystal tuning fork tine is connected to the second electrode formed on each of the first and second side surfaces of the second quartz crystal tuning fork tine and the first electrode formed on the side surface of the at least one groove formed in the central linear portion of each of the first and second main surfaces of the second quartz crystal tuning fork tine is connected to the second electrode formed on each of the first and second side surfaces of the first quartz crystal tuning fork tine, and the oscillation frequency of the fundamental mode of vibration of the quartz crystal tuning fork resonator comprises a first preselected oscillation frequency; forming a metal film on at least one of the opposite main surfaces of the first and second quartz crystal tuning fork tines so that the oscillation frequency of the fundamental mode of vibration of the quartz crystal tuning fork resonator comprises a second preselected oscillation frequency; trimming the metal film formed on the at least one of the opposite main surfaces of the first and second quartz crystal tuning fork tines so that the oscillation frequency of the fundamental mode of vibration of the quartz crystal tuning fork resonator comprises a third preselected oscillation frequency; mounting the quartz crystal tuning fork resonator on the mounting portion of the case; adjusting the oscillation frequency of the fundamental mode of vibration of the quartz crystal tuning fork resonator so that the oscillation frequency of the quartz crystal tuning fork resonator comprises a fourth preselected oscillation frequency; and electrically connecting the quartz crystal tuning fork resonator to the amplifier, the at least one resistor and the capacitors.

31. A method according to claim 30; wherein the first preselected oscillation frequency is higher than 32.768 kHz; wherein the second preselected oscillation frequency is in the range of 29.4 kHz to 32.75 kHz; wherein the third preselected oscillation frequency is in the range of 32.2 kHz to 33.08 kHz; and wherein the fourth preselected oscillation frequency is in the range of 32.764 kHz to 32.772 kHz.

32. A method according to claim 30; further comprising the step of connecting a lid to the case to cover an open end of the case; wherein the adjusting step of the oscillation frequency is performed after the mounting step and before the connecting step of the lid and the case so that the fourth preselected oscillation frequency is in the range of 32.764 kHz to 32.772 kHz or in a vacuum after the connecting step of the lid and the case and before the disposing step of the metal or the glass so that the fourth preselected oscillation frequency is in the range of 32.764 kHz to 32.772 kHz or after the disposing step of the metal or the glass and before the electrically connecting step so that the fourth preselected oscillation frequency is in the range of 32.766 kHz to 32.77 kHz.

33. A method according to claim 16; wherein the quartz crystal tuning fork resonator has a second overtone mode of vibration; wherein the opposite main surfaces have a first main surface and a second main surfaces; and further comprising the steps of forming at least one groove in each of the first and second main surfaces of each of the first and second quartz crystal tuning fork tines; forming an electrode on a side surface of the at least one groove formed in each of the first and second main surfaces of each of the first and second quartz crystal tuning fork tines, each of the quartz crystal tuning fork shape, the at least one groove formed in each of the first and second main surfaces of each of the first and second quartz crystal tuning fork tines and the electrode formed on the side surface of the at least one groove formed in each of the first and second main surfaces of each of the first and second quartz crystal tuning fork tines having a dimension; and determining the dimension of each of the quartz crystal tuning fork shape; the at least one groove formed in each of the first and second main surfaces of each of the first and second quartz crystal tuning fork tines and the electrode formed on the side surface of the at least one groove formed in each of the first and second main surfaces of each of the first and second quartz crystal tuning fork tines so that a capacitance ratio $r_1$ of the fundamental mode of vibration of the quartz crystal tuning fork resonator is less than a capacitance ratio $r_2$ of the second overtone mode of vibration thereof.

34. A method according to claim 16; wherein the quartz crystal tuning fork resonator has a second overtone mode of vibration, and a stable factor $S_1$ of the fundamental mode of vibration and a stable factor $S_2$ of the second overtone mode of vibration, the stable factor $S_1$ being defined by $S_1=r_1/2Q_1^2$ and the stable factor $S_2$ being defined by $S_2=r_2/2Q_2^2$, where $Q_1$ and $Q_2$ represent a quality factor of the fundamental mode of vibration and the second overtone mode of vibration, respectively, of the quartz crystal tuning fork resonator and $r_1$ and $r_2$ represent a capacitance ratio of the fundamental mode of vibration and the second overtone mode of vibration, respectively, of the quartz crystal tuning fork resonator; wherein the opposite main surfaces have a first main surface and a second main surface; and further comprising the steps of forming at least one groove in each of the first and second main surfaces of each of the first and second quartz crystal tuning fork tines; forming an electrode on a side surface of the at least one groove formed in each of the first and second main surfaces of each of the first and second quartz crystal tuning fork tines, each of the quartz crystal tuning fork shape, the at least one groove formed in each of the first and second main surfaces of each of the first and second quartz crystal tuning fork tines and the electrode formed on the side surface of the at least one groove formed in each of the first and second main surfaces of each of the first and second quartz crystal tuning fork tines having a dimension; and determining the dimension of each of the quartz crystal tuning fork shape, the at least one groove formed in each of the first and second main surfaces of each of the first and second quartz crystal tuning fork tines and the electrode formed on the side surface of the at least one groove formed in each of the first and second main surfaces of each of the first and second quartz crystal tuning fork tines so that the stable factor $S_1$ of the fundamental mode of vibration of the quartz crystal tuning fork resonator is less than the stable factor $S_2$ of the second overtone mode of vibration thereof.

35. A method according to claim 16; wherein the quartz crystal tuning fork resonator has a second overtone mode of vibration; wherein the quartz crystal oscillating circuit comprises a amplification circuit having the amplifier and a feedback circuit having the quartz crystal tuning fork resonator, the at least one resistor and the capacitors, each of the at least one resistor and the capacitors having a value; wherein the amplification circuit has a negative resistance $-RL_1$ of the fundamental mode of vibration of the quartz crystal tuning fork resonator and a negative resistance $-RL_2$ of the second overtone mode of vibration thereof, $|-RL_1|$ representing the absolute value of the negative resistance $-RL_1$ and $|-RL_2|$ representing the absolute value of the negative resistance $-RL_2$; wherein the quartz crystal tuning fork resonator has a series resistance $R_1$, an angular frequency $\omega_1$ and a quality factor $Q_1$ of the fundamental mode of vibration and a series resistance $R_2$, an angular frequency $\omega_2$ and a quality factor $Q_2$ of the second overtone mode of vibration; wherein a rise time $t_{r1}$ of the fundamental mode of vibration of the quartz crystal tuning fork resonator of the quartz crystal oscillating circuit is defined by $t_{r1}=kQ_1/(\omega_1(-1+|-RL_1|/R_1))$ and a rise time $t_{r2}$ of the second overtone mode of vibration of the quartz crystal tuning fork resonator of the quartz crystal oscillating circuit is defined by $t_{r2}=kQ_2/(\omega_2(-1+|-RL_2|/R_2))$, where k is a constant value; wherein the opposite main surfaces have a first main surface and a second main surfaces; and further comprising the steps of forming at least one groove in each of the first and second main surfaces of each of the first and second quartz crystal tuning fork tines; forming an electrode on a side surface of the at least one groove formed in each of the first and second main surfaces of each of the first and second quartz crystal tuning fork tines, each of the quartz crystal tuning fork shape, the at least one groove formed in each of the first and second main surfaces of each of the first and second quartz crystal tuning fork tines and the electrode formed on the side surface of the at least one groove formed in each of the first and second main surfaces of each of the first and second quartz crystal tuning fork tines having a dimension; and determining the dimension of each of the quartz crystal tuning fork shape, the at least one groove formed in each of the first and second main surfaces of each of the first and second quartz crystal tuning fork tines and the electrode formed on the side surface of the at least one groove formed in each of the first and second main surfaces of each of the first and second quartz crystal tuning fork tines, the absolute value of each of the negative resistances $-RL_1$ and $-RL_2$ and the value of each of the at least one resistor and the capacitors so that the rise time $t_{r1}$ is less than the rise time $t_{r2}$.

36. A method according to claim 16; wherein the case is a ceramics case having an interior space and a mounting portion in the interior space, and a through-hole; wherein the opposite main surfaces have a first main surface and a second main surface; wherein the quartz crystal tuning fork resonator has a second overtone mode of vibration; and further comprising the steps of forming the quartz crystal tuning fork resonator in the quartz crystal wafer having a thickness in the range of 0.05 mm to 0.12 mm; forming the first and second quartz crystal tuning fork tines, and the quartz crystal tuning fork base having a first base portion including a first width $W_5$ and a second base portion including a second width $W_6$ greater than or equal to the first width $W_5$ so that a spaced-apart distance between the first and second quartz crystal tuning fork tines is within a range of 0.05 mm to 0.35 mm and two cut portions are formed between the first and second base portions of the quartz crystal tuning fork base, each of the first and second quartz crystal tuning fork tines being connected to the first base portion of the quartz crystal tuning fork base; forming at least one groove in each of the first and second main surfaces of each of the first and second quartz crystal tuning fork tines so that the at least one groove has stepped portions more than two including first, second and third stepped portions along the length of the corresponding one of the first and second quartz crystal tuning fork tines, at least two of the first, second and third stepped portions being connected through at least one stepped portion, and a width of the at least one groove formed in each of the first and second main surfaces of each of the first and second quartz crystal tuning fork tines is in the range of 0.02 mm to 0.068 mm and less than the spaced-apart distance within the range of 0.05 mm to 0.35 mm; forming a first electrode on each of the first, second and third stepped portions of the at least one groove formed in each of the first and second main surfaces of each of the first and second quartz crystal tuning fork tines and a second electrode on each of the first and second side surfaces of each of the first and second quartz crystal tuning fork tines so that the first electrode formed on each of the first, second and third stepped portions of the at least one groove formed in each of the first and second main surfaces of the first quartz crystal tuning fork tine is connected to the second electrode formed on each of the first and second side surfaces of the second quartz crystal tuning fork tine and the first electrode formed on each of the first, second and third stepped portions of the at least one groove formed in each of the first and second main surfaces of the second quartz crystal tuning fork tine is connected to the second electrode formed on each of the first and second side surfaces of the first quartz crystal tuning fork tine, and the oscillation frequency of the fundamental mode of vibration of the quartz crystal tuning fork resonator is higher than 32.768 kHz; mounting the second base portion of the quartz crystal tuning fork base on the mounting portion in the interior space of the ceramics case by a conductive adhesive or a solder; connecting a glass lid to the ceramics case to cover an open end of the ceramics case; disposing a metal or a glass into the through-hole of the ceramics case to close the through-hole thereof in a vacuum; adjusting the oscillation frequency of the fundamental mode of vibration of the quartz crystal tuning fork resonator after the mounting step and before the connecting step of the glass lid and the ceramics case so that the oscillation frequency thereof is in the range of 32.764 kHz to 32.772 kHz or adjusting the oscillation frequency of the fundamental mode of vibration of the quartz crystal tuning fork resonator after the disposing step of the metal or the glass so that the oscillation frequency thereof is in the range of 32.766 kHz to 32.77 kHz or adjusting in a vacuum the oscillation frequency of the fundamental mode of vibration of the quartz crystal tuning fork resonator after the connecting step of the glass lid and the ceramics case and before the disposing step of the metal or the glass so that the oscillation frequency thereof is in the range of 32.736 kHz to 32.8 kHz; and after the adjusting step, electrically connecting the quartz crystal tuning fork resonator to the amplifier, the at least one resistor and the capacitors; wherein each of the quartz crystal tuning fork shape, the at least one groove formed in each of the first and second main surfaces of each of the first and second quartz crystal tuning fork tines and the first electrode formed on each of the first, second and third stepped portions of the at least one groove formed in each of the first and second main surfaces of each of the first and second quartz crystal tuning fork tines has a dimension; and further comprising the step of determining the dimension of each of the quartz crystal tuning fork shape, the at least one groove formed in each of the first and second main surfaces of each of the first and second quartz crystal tuning fork tines and the first electrode formed on each of the first, second and third stepped portions of the at least one groove formed in each of the first and second main surfaces of each of the first and second quartz crystal tuning fork tines so that a capacitance ratio $r_1$ of the fundamental mode of vibration of the quartz crystal tuning fork resonator is less than a capacitance ratio $r_2$ of the second overtone mode of vibration thereof.

37. A method according to claim 16; wherein the case is a ceramics case having an interior space and a mounting portion in the interior space, and a through-hole; wherein the opposite main surfaces have a first main surface and a second main surface; wherein the quartz crystal tuning fork resonator has a second overtone mode of vibration; and further comprising the steps of forming the quartz crystal tuning fork resonator in the quartz crystal wafer having a thickness in the range of 0.05 mm to 0.12 mm; forming the first and second quartz crystal tuning fork tines, and the quartz crystal tuning fork base having a first base portion including a first width $W_5$ and a second base portion including a second width $W_6$ greater than or equal to the first width $W_5$ so that a spaced-apart distance between the first and second quartz crystal tuning fork tines is within a range of 0.05 mm to 0.35 mm and two cut portions are formed between the first and second base portions of the quartz crystal tuning fork base, each of the first and second quartz crystal tuning fork tines being connected to the first base portion of the quartz crystal tuning fork base; forming at least one groove in each of the first and second main surfaces of each of the first and second quartz crystal tuning fork tines so that and a width of the at least one groove formed in each of the first and second main surfaces of each of the first and second quartz crystal tuning fork tines is in the range of 0.02 mm to 0.068 mm and less than the spaced-apart distance within the range of 0.05 mm to 0.35 mm, and a length of the at least one groove formed in each of the first and second main surfaces of each of the first and second quartz crystal tuning fork tines is within a range of 40% to 80% of a length of each of the first and second quartz crystal tuning fork tines; forming a first electrode on a side surface of the at least one groove formed in each of the first and second main surfaces of each of the first and second quartz crystal tuning fork tines and a second electrode on each of the first and second side surfaces of each of the first and second quartz crystal tuning fork tines so that the first electrode formed on the side surface of the at least one groove formed in each of the first and second main surfaces of the first quartz crystal tuning fork tine is connected to the second electrode formed on each of the first and second side surfaces of the second quartz crystal tuning fork tine and the first electrode formed on the side surface of the at least one groove formed in each of the first and second main surfaces of the second quartz crystal tuning fork tine is connected to the second electrode formed on each of the first and second side surfaces of the first quartz crystal tuning fork tine, and the oscillation frequency of the fundamental mode of vibration of the quartz crystal tuning fork resonator is higher than 32.768 kHz; mounting the quartz crystal tuning fork resonator on the mounting portion in the interior space of the ceramics case by a conductive adhesive or a solder; connecting a metal lid to the ceramics case to cover an open end of the ceramics case; disposing a metal or a glass into the through-hole of the ceramics case to close the through-hole thereof in a vacuum; adjusting the oscillation frequency of the fundamental mode of vibration of the quartz crystal tuning fork resonator after the mounting step and before the connecting step of the metal lid and the ceramics case so that the oscillation frequency thereof is in the range of 32.764 kHz to 32.772 kHz; and after the adjusting step, electrically connecting the quartz crystal tuning fork resonator to the amplifier, the at least one resistor and the capacitors; wherein each of the quartz crystal tuning fork shape, the at least one groove formed in each of the first and second main surfaces of each of the first and second quartz crystal tuning fork tines and the first electrode formed on the side surface of the at least one groove formed in each of the first and second main surfaces of each of the first and second quartz crystal tuning fork tines has a dimension; and further comprising the step of determining the dimension of each of the quartz crystal tuning fork shape, the at least one groove formed in each of the first and second main surfaces of each of the first and second quartz crystal tuning fork tines and the first electrode formed on the side surface of the at least one groove formed in each of the first and second main surfaces of each of the first and second quartz crystal tuning fork tines so that a capacitance ratio $r_1$ of the fundamental mode of vibration of the quartz crystal tuning fork resonator is less than a capacitance ratio $r_2$ of the second overtone mode of vibration thereof.

38. A method according to claim 16; wherein the quartz crystal tuning fork resonator has a shunt capacitance and a second overtone mode of vibration; wherein a frequency difference of a mechanical resonance frequency independent on the shunt capacitance of the fundamental mode of vibration of the quartz crystal tuning fork resonator and a resonance frequency dependent on the shunt capacitance of the fundamental mode of vibration thereof is defined by $\Delta f_1$ and a frequency difference of a mechanical resonance frequency independent on the shunt capacitance of the second overtone mode of vibration of the quartz crystal tuning fork resonator and a resonance frequency dependent on the shunt capacitance of the second overtone mode of vibration thereof is defined by $\Delta f_2$; wherein the quartz crystal tuning fork resonator has a quality factor $Q_1$ and a capacitance ratio $r_1$ of the fundamental mode of vibration and a merit value $M_1$ defined by the ratio $(Q_1/r_1)$, and a quality factor $Q_2$ and a capacitance ratio $r_2$ of the second overtone mode of vibration and a merit value $M_2$ defined by the ratio $(Q_2/r_2)$; wherein the opposite main surfaces have a first main surface and a second main surface; and further comprising the steps of forming at least one groove in each of the first and second main surfaces of each of the first and second quartz crystal tuning fork tines; forming an electrode on a side surface of the at least one groove formed in each of the first and second main surfaces of each of the first and second quartz crystal tuning fork tines so that the electrode formed on the side surface of the at least one groove formed in each of the first and second main surfaces of the first quartz crystal tuning fork tine has an electrical polarity opposite to an electrical polarity of the electrode formed on the side surface of the at least one groove formed in each of the first and second main surfaces of the second quartz crystal tuning fork tine, each of the quartz crystal tuning fork shape, the at least one groove formed in each of the first and second main surfaces of each of the first and second quartz crystal tuning fork tines and the electrode formed on the side surface of the at least one groove formed in each of the first and second main surfaces of each of the first and second quartz crystal tuning fork tines having a dimension; and determining the dimension of each of the quartz crystal tuning fork shape, the at least one groove formed in each of the first and second main surfaces of each of the first and second quartz crystal tuning fork tines and the electrode formed on the side surface of the at least one groove formed in each of the first and second main surfaces of each of the first and second quartz crystal tuning fork tines so that the frequency differences $\Delta f_1$ of the fundamental mode of vibration of the quartz crystal tuning fork resonator is less than the frequency difference $\Delta f_2$ of the second overtone mode of vibration thereof and the merit value $M_1$ of the fundamental mode of vibration of the quartz crystal tuning fork resonator is greater than the merit value $M_2$ of the second overtone mode of vibration thereof; wherein the merit value $M_2$ is less than 30.

* * * * *